(12) United States Patent
Sato

(10) Patent No.: US 8,742,260 B2
(45) Date of Patent: Jun. 3, 2014

(54) CIRCUIT BOARD DEVICE AND CIRCUIT BOARD MODULE DEVICE

(75) Inventor: Junya Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 217 days.

(21) Appl. No.: 12/446,337

(22) PCT Filed: Oct. 5, 2007

(86) PCT No.: PCT/JP2007/069546
§ 371 (c)(1),
(2), (4) Date: Apr. 20, 2009

(87) PCT Pub. No.: WO2008/047619
PCT Pub. Date: Apr. 24, 2008

(65) Prior Publication Data
US 2010/0315789 A1 Dec. 16, 2010

(30) Foreign Application Priority Data
Oct. 18, 2006 (JP) .................. 2006-284061

(51) Int. Cl.
*H05K 1/00* (2006.01)
(52) U.S. Cl.
USPC ........... 174/254; 174/255; 361/749; 361/784; 361/750; 361/751
(58) Field of Classification Search
USPC .................. 174/254; 361/749, 784, 750, 751; 257/109
See application file for complete search history.

(56) References Cited

U.S. PATENT DOCUMENTS

| 4,330,165 | A | * | 5/1982 | Sado | 439/91 |
| 5,408,052 | A | * | 4/1995 | Inaba et al. | 174/261 |
| 6,027,958 | A | * | 2/2000 | Vu et al. | 438/110 |
| 6,392,143 | B1 | * | 5/2002 | Koshio | 174/528 |
| 6,417,027 | B1 | * | 7/2002 | Akram | 438/109 |
| 6,483,037 | B1 | * | 11/2002 | Moore et al. | 174/254 |
| 2006/0216909 | A1 | * | 9/2006 | Yamazaki et al. | 438/457 |

FOREIGN PATENT DOCUMENTS

| JP | 1981008081 A | 1/1981 |
| JP | 1982082883 A | 5/1982 |
| JP | 1990094689 A | 4/1990 |

(Continued)

OTHER PUBLICATIONS

JP 1996-185943 English translation.*

(Continued)

*Primary Examiner* — Tuan T Dinh
*Assistant Examiner* — Steven T Sawyer
(74) *Attorney, Agent, or Firm* — Sughrue Mion, PLLC

(57) ABSTRACT

Provided is a circuit board device in which printed wiring boards 11, 12 are connected to each other electrically using a anisotropic conductive member 15 disposed between the printed wiring boards 11, 12. The anisotropic conductive member 15 comprises: an insulating elastic resin material 16; fine metal wires 17 having a middle portion embedded within the insulating elastic resin material 16 so as to connect corresponding connecting terminals of the printed wiring boards 11, 12; and resin layers 18 exhibiting a flexural rigidity greater than that of the insulating elastic resin material. An assembly composed of the printed wiring boards 11, 12 and anisotropic conductive member 15 is curved. The resin layers are shape-retaining resins for maintaining the curvature of respective ones of principal surfaces of the anisotropic conductive member 15 made to conform to curvature of the printed wiring boards 11, 12.

8 Claims, 19 Drawing Sheets

(56) References Cited

FOREIGN PATENT DOCUMENTS

| | | | |
|---|---|---|---|
| JP | 3007244 | A | 2/1995 |
| JP | 1995066844 | B | 7/1995 |
| JP | 1996185943 | A | 7/1996 |
| JP | 2001223465 | A | 8/2001 |
| JP | 2002353369 | A | 12/2002 |
| JP | 2003318218 | A | 11/2003 |
| JP | 2005236256 | A | 9/2005 |
| JP | 2006059836 | A | 3/2006 |

OTHER PUBLICATIONS

International Search Report for PCT/JP2007/069546 mailed Jan. 15, 2008.

K. Motoki, et al., "Connecting Technology of Anisotropic Conductive Materials", Fujikura Giho, Fujikura K.K., Oct. 2000, No. 99, p. 32-38.

* cited by examiner

FIRST EXEMPLARY EMBODIMENT

FIRST EXEMPLARY EMBODIMENT

FIRST EXEMPLARY EMBODIMENT

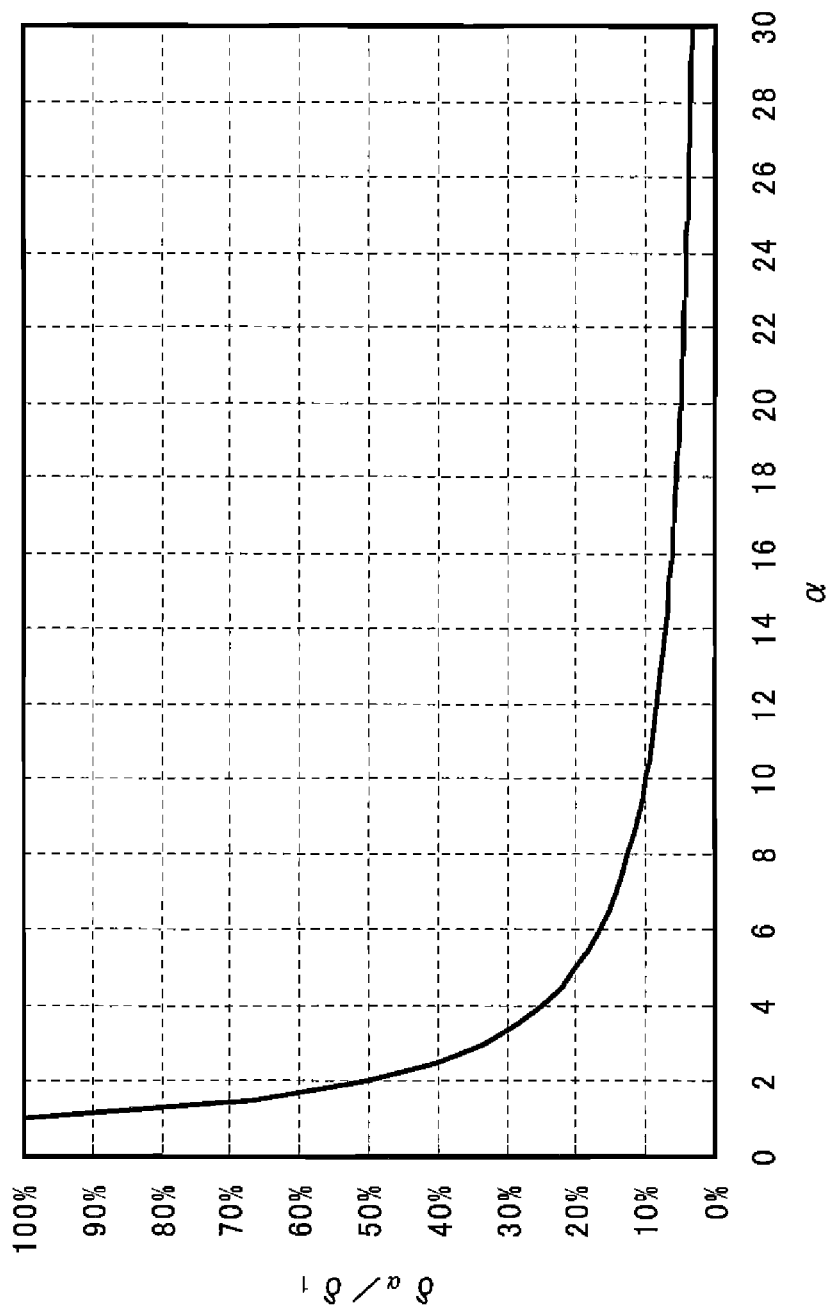
FIG. 4  FIRST EXEMPLARY EMBODIMENT

THIRD EXEMPLARY EMBODIMENT

THIRD EXEMPLARY EMBODIMENT

EXEMPLARY EMBODIMENT 6-1

EXEMPLARY EMBODIMENT 6-2

EXEMPLARY EMBODIMENT 7-1

EXEMPLARY EMBODIMENT 7-2

EIGHTH EXEMPLARY EMBODIMENT

PRIOR ART 1

PROBLEM WITH PRIOR ART
(SECTOR-SHAPED)

PROBLEM WITH PRIOR ART
(SECTOR-SHAPED)

PROBLEM WITH PRIOR ART
(SECTOR-SHAPED)

CIRCUIT BOARD DEVICE AND CIRCUIT BOARD MODULE DEVICE

RELATED APPLICATION

This application is the National Phase of PCT/JP2007/069546, filed Oct. 5, 2007, which claims priority to Japanese Patent Application No. 2006-284061, filed on Oct. 18, 2006, which is incorporated herein by reference in its entirety.

TECHNICAL FIELD

The present invention relates to a circuit board device having a structure in which a plurality of wiring boards are interconnected electrically and mechanically, and to a circuit board module device. More particularly, the invention relates to a circuit board device that employs an anisotropic conductive member as a connecting medium, and to a circuit board module device.

BACKGROUND ART

Conventionally, in mobile telephone devices, PDA (Personal Digital Assistant) terminals and other electronic devices used in many electrical and communication fields, a plurality of printed wiring boards such as flexible printed wiring boards and rigid printed wiring boards on which many electronic components have been mounted are installed in the confined space of a package. Generally a structure using a connector or a structure using a connecting medium such as solder, ACF (Anisotropic Conductive Film) or an anisotropic conductive member is employed as a structure for interconnecting these printed wiring boards (e.g., see Patent Documents 1 to 4 and Non-Patent Document 1). Recently, however, since styling based upon human engineering for the purpose of enhancing external beauty, operability and portability have come to be sought for electronic devices, there is increasing demand for a greater degree of freedom regarding the shape of printed wiring boards and, in particularly, for the curving of these printed circuit boards.

FIG. 12 is disclosed in Patent Document 1. This is a circuit-board connecting structure in which a plurality of wiring boards are interconnected electrically and mechanically using a connector employed heretofore (Prior Art 1). This is a structure in which a socket 100 is provided with a pair of contact devices 159a, 159b having first contactors, second contactors are disposed on respective ones of both sides of a plug 101, and a number of the first and second contactors are connected electrically and mechanically at one time.

FIG. 13 is disclosed in Patent Document 2. This is a circuit-board connecting structure in which a plurality of wiring boards are interconnected electrically and mechanically using solder employed heretofore as a connecting medium (Prior Art 2). This is a structure in which a land 213a of a conductive pattern 213, which has been formed on the connecting surface of a flexible printed wiring board 205 employing a thermoplastic resin as an insulating substrate material, and a land 211a of a conductive pattern 211 that has been formed on the connecting surface of a rigid printed wiring board 202 are connected electrically and mechanically via solder 214.

FIG. 14 is disclosed in Non-Patent Document 1. This is a circuit-board connecting structure in which a plurality of wiring boards are interconnected electrically and mechanically using ACF employed heretofore as a connecting medium (Prior Art 3). This is a structure in which a flexible printed wiring board 301 having wiring formed on a PET substrate and a glass substrate 302 are connected electrically and mechanically by ACF 303 that will serve as an Ag circuit. Connection is achieved by application of heat and pressure using a heating and pressurizing tool 304.

FIG. 15 is disclosed in Patent Document 3. This is a circuit-board connecting structure in which a plurality of wiring boards are interconnected electrically and mechanically using an anisotropic conductive member employed heretofore as a connecting medium (Prior Art 4). This is a structure in which a electrical connecting member 404 having a conductive member such as a fine metal wire embedded in an insulating plastic member is compressed to thereby connect a rigid printed wiring board 405 and a flexible printed wiring board 403 electrically and mechanically.

FIG. 16 is disclosed in Patent Document 4. This is a circuit-board connecting structure in which a plurality of wiring boards are interconnected electrically and mechanically using an anisotropic conductive member employed heretofore as a connecting medium (Prior Art 5). This is a structure in which a plurality of wiring boards are connected electrically and mechanically using a connector sheet 501 provided with an electrical insulating sheet-like substrate 511, which has adhesion layers disposed on respective ones of a top side 511a and bottom side 511b, and a plurality of conductive members 520 each of which passes through the sheet-like substrate 511 in the thickness direction, the connector 501 having stickiness under a first condition and exhibiting adhesion under a second condition different from the first condition.

[Patent Document 1] Japanese Patent Kokoku Publication No. 7-66844B ([0086] to [0091]; FIGS. 29 to 32)

[Patent Document 2] Japanese Patent Kokai Publication No. 2001-223465A ([0015] to [0027]; FIGS. 1 to 4)

[Patent Document 3] Japanese Utility Model Registration No. 3007244 ([0005] to [0008]; FIGS. 1 to 4)

[Patent Document 4] Japanese Patent Kokai Publication No. 2005-236256 ([0072], [0127] to [0137], [0140] to [0144]; FIGS. 1 and 2, FIGS. 4 to 6, FIG. 7))

[Non-Patent Document 1] K. Motoki and 11 others, "Connecting Technology of Anisotropic Conductive Materials", Fujikura Giho, Fujikura K. K., October, 2000, No. 99, pp. 32-38

SUMMARY

It should be noted that the content disclosed in Patent Documents 1 to 4 and in Non-Patent Document 1 are hereby incorporated herein by reference thereto in their entirety.

The problems set forth below arise in the case of a connecting structure that uses a connector, as in Prior Art 1 (see FIG. 12).

The connector generally has its external shape defined by a resin mold. As a result, the resin portion of the connector has very little flexibility and it is difficult to impart curvature after planar printed wiring boards are connected together.

Further, in a case where printed wiring boards imparted with curvature are connected together, it is possible to accommodate the curving if a mold that matches the curvature of the printed wiring boards is prepared for each of the individual specifications of the printed circuit board. In such case, however, there is an increase in the types of molds and, in the assembly process, it is necessary to manage connectors in conformity with each curvature of printed circuit board connected. As a consequence, the initial expense for connector manufacture and the expense for parts management is greater than in the prior art. In other words, a problem which arises is an increase in product cost.

The problems set forth below arise in the case of a connecting structure that employs solder or ACF as the connecting medium as in Prior Art 2 and 3 (see FIGS. 13 and 14).

A problem which arises is that if curvature is imparted after the planar printed wiring boards are connected together, a faulty connection such as an open connection or short tends to occur if the solder or ACF, which usually exhibits a coefficient of elasticity higher than that of the wiring board, cannot withstand stress in the shearing direction produced in the connection surface.

Further, in a case where printed wiring boards imparted with curvature in advance are connected together, an expensive tool (generally made of metal) for heating and pressurizing a connection location that matches the curvature of the printed wiring boards is required to be prepared for each of the individual specifications of the printed wiring boards. The result is an increase in the cost of the manufacturing facilities. In other words, a problem which arises is an increase in product cost.

In the case of a connecting structure that employs an anisotropic conductive member, as in Prior Art 4 (see FIG. 15), problems of the kind illustrated in FIGS. 17A to C, FIGS. 18A to C and FIGS. 19A and B arise.

FIGS. 17A to C are process perspective views for describing the problem of a circuit-board connecting structure in which a plurality of wiring boards are interconnected using an anisotropic member employed conventionally. FIGS. 18A to C are process perspective views for describing the problem of circuit-board connecting structure in which a plurality of wiring boards are interconnected using an anisotropic member employed conventionally, in which A is a sectional view seen along A-A in FIG. 17A, B a sectional view seen along A-A in FIGS. 17B, and C a sectional view seen along A-A in FIG. 17C. FIGS. 19A and B are sectional views of a principal portion for describing another problem of a circuit-board connecting structure in which a plurality of wiring boards are interconnected using an anisotropic member employed conventionally.

As shown in FIGS. 17A to C and 18A to C, connecting terminals 613 of a first wiring board 611 are equipped with an anisotropic conductive member 615 in which fine metal wires 617 are embedded within an insulating plastic resin material 616. The first wiring board 611 is imparted with curvature. When this is done, the anisotropic conductive member 615 is deformed into a sector shape about the principal surface of the first wiring board 611 on the side having the connecting terminals 613, while the portions of the fine metal wires 617 projecting upwardly away from the connecting terminals of the first wiring board 611 develop a pitch wider than that of the portions of the fine metal wires 617 that are in contact with the connecting terminals of the first wiring board 611. When the first wiring board 611 thus equipped with the anisotropic conductive member 615 and imparted with curvature and a second wiring board 612 previously imparted with curvature are subsequently stacked, the pitch of those portions of the fine metal wires 617 that correspond to connecting terminals 614 on the second wiring board 612 develop a pitch wider than that of those portions of the fine metal wires 617 that are in contact with the connecting terminals 613 of the first wiring board 611. This means that it is necessary to perform manufacture and design the pitch of the connecting terminals 613 on the first wiring board 611 and the pitch of the connecting terminals 614 on the second wiring board 612 while predicting the change in the pitch of the fine metal wires 617. In other words, it is required that manufacture be performed by designing the pitches of the connecting terminals 613 and 614 individually in accordance with the thickness of the anisotropic conductive member 615 and the curvature imparted to the first wiring board 611 and second wiring board 612.

Further, in a case where planar printed wiring boards are imparted with curvature after they are connected together, the anisotropic conductive member 615 sandwiched between the first wiring board 611 and second wiring board 612 becomes as shown in FIGS. 19A and B. Conventionally, however, since the anisotropic conductive member 615 assumes the sector shape, as shown in FIG. 18C, a restoration force acts, stress in the shearing direction is produced at the interface between the connecting terminals 614 on the second wiring board 612 and the fine metal wires 617 embedded in the anisotropic conductive member 615, a decline in contact pressure develops as well as a positional deviation between the connecting terminals 614 and fine metal wires 617 and the resulting problem is that a faulty connection such as an open connection or short tends to occur.

In the case of a connecting structure that employs an anisotropic conductive member, as in Prior Art 5 (see FIG. 16), a problem of the kind set forth below arises.

The entirety of the contact sheet is made to contain a curable resin. When the contact sheet is cured completely, there is a decline in its elastic property. As a consequence, it is not possible to realize a structure in which the anisotropic conductive member is pressurized and compressed to produce a repulsive restoration force in the insulating elastic resin material and the restoration force is utilized to maintain the contact pressure between the fine metal wires and connecting terminals on each of the wiring boards, thereby assuring an electrically connected state.

Further, in Patent Document 4, a three-layer structure is exemplified as another form of the invention. In the three-layer structure, a sheet-like material employs a connector sheet as a center layer and adhesion layers are formed on the top and bottom surfaces of the sheet-like material. In this example also, however, the sheet material serving as the center layer is defined as a thermoplastic film (polyimide film or polyphenylene sulfide film), a woven fabric (woven or knitted organic or inorganic fibers) or a non-woven fabric (short fibers of organic or inorganic fibers rendered into paper form by a paper-making technique) permeated with a heat-curable resin. These materials exhibit little elasticity. Consequently, it is impossible to realize a structure in which the anisotropic conductive member is pressurized and compressed to produce a repulsive restoration force in the insulating elastic resin material and the restoration force is utilized to maintain the contact pressure between the fine metal wires and connecting terminals on each of the wiring boards, thereby assuring an electrically connected state. Further, in a manner similar to the case of Prior Art 4 (see FIG. 15), the problem that a faulty connection such as an open connection or short ascribable to the restoration force of the anisotropic conductive member tends to occur still remains.

As described above, in the conventional connecting structures for circuit boards obtained by interconnecting a plurality of wiring boards, a circuit board device in which a plurality of wiring boards are electrically connected together and imparted with curvature is difficult to realize without causing the occurrence of faulty electrical connections such as open connections or shorts and without raising product cost.

It is a principal object of the present invention to provide a circuit board device devoid of faulty electrical connections such as open connections and shorts even when the board is imparted with curvature, and which will not raise product cost, as well as a circuit board module device.

In a first aspect of the present invention, there is provided a circuit board device in which a plurality of wiring boards are electrically connected together using an anisotropic conductive member disposed between the plurality of wiring boards, characterized in that the anisotropic conductive member comprises an insulating elastic resin material; fine metal wires having a middle portion embedded within the insulating elastic resin material so as to connect corresponding connecting terminals of the plurality of wiring boards; and resin layers exhibiting a flexural rigidity greater than that of the insulating elastic resin material; wherein an assembly of the plurality of wiring boards and anisotropic conductive member is curved.

In the circuit board device of the present invention, the resin layers preferably are shape-retaining resins for maintaining curvature of respective ones of principal surfaces of the anisotropic conductive member made to conform to curvature of the plurality of wiring boards.

In the circuit board device of the present invention, the anisotropic conductive member preferably has the resin layers on all or a portion of respective ones of the principal surfaces that oppose the plurality of wiring boards.

In the circuit board device of the present invention, the anisotropic conductive member preferably has the resin layers partially at locations other than an area in which are disposed the fine metal wires on respective ones of the principal surfaces that oppose the plurality of wiring boards.

In the circuit board device of the present invention, the anisotropic conductive member preferably has the resin layers on all or a portion of opposing side faces other than the principal surfaces that oppose the plurality of wiring boards.

In the circuit board device of the present invention, overall flexural rigidity of the resin layers preferably is ten or more times a flexural rigidity of the insulating elastic resin material.

In the circuit board device of the present invention, the resin layers preferably comprise at least one resin from among a heat-curable resin, thermoplastic resin and ultraviolet-curable resin.

In the circuit board device of the present invention, preferably the device is formed by connecting the plurality of wiring boards, which are flat, together electrically using the anisotropic conductive member, which is flat, and thereafter curving the assembly of the plurality of wiring boards and anisotropic conductive member.

In the circuit board device of the present invention, preferably the device is formed by sandwiching the anisotropic conductive member, which has a curvature beforehand, between the plurality of wiring boards, which have a curvature beforehand.

In a second aspect of the present invention, there is provided a circuit board module device in which a plurality of modules are electrically connected together using an anisotropic conductive member disposed between the plurality of modules, each module having one or a plurality of mounted components surface-mounted on a wiring board, characterized in that the anisotropic conductive member comprises an insulating elastic resin material; a fine metal wire having a middle portion embedded within the insulating elastic resin material so as to connect corresponding connecting terminals of the plurality of wiring boards; and resin layers exhibiting a flexural rigidity greater than that of the insulating elastic resin material; wherein an assembly of the plurality of modules and anisotropic conductive member is curved.

EFFECTS OF THE INVENTION

In accordance with the present invention, shape-retaining resins exhibiting a flexural rigidity greater than that of an insulating elastic resin material that constitutes an anisotropic conductive member are formed on respective ones of the two surfaces of the anisotropic conductive member that oppose the wiring boards, and the curvature of respective ones of the principal surfaces of the anisotropic conductive member that matches the curvature of each of the wiring boards is maintained. As a result, a force in the shearing direction ascribable to restoration force of the insulating elastic resin material no longer acts upon the surface of contact between the connecting terminals on the wiring boards and the fine metal wires disposed in the anisotropic conductive member, and a decline in contact pressure and a positional deviation between the connecting terminals and fine metal wires no longer occur. This makes it possible to realize a circuit board device and circuit board module device that exhibit highly stable DC electrical resistance values without electrical problems such as open connections and shorts.

Further, a conventional mass-produced article can be used as the anisotropic conductive member as is. This makes it possible to minimize initial resources for fabricating the anisotropic conductive member. In addition, special-purpose tools for dealing with each of the individual curvature specifications of wiring boards are unnecessary and there is no need for individual design and individual fabrication of wiring boards that take into consideration the thickness of the anisotropic conductive member and the pitch of connecting terminals that conform to the curvature imparted to the wiring boards. This makes it possible to realize a circuit board device the cost of which can be reduced.

BRIEF DESCRIPTION OF THE DRAWINGS

FIG. 4 is a graph representing the relationship between deflection amounts $\delta 1$ and $\delta \alpha$ at a rigidity ratio $\alpha=1$ to 30 in a circuit board device according to a first exemplary embodiment of the present invention;

Figure 1A:
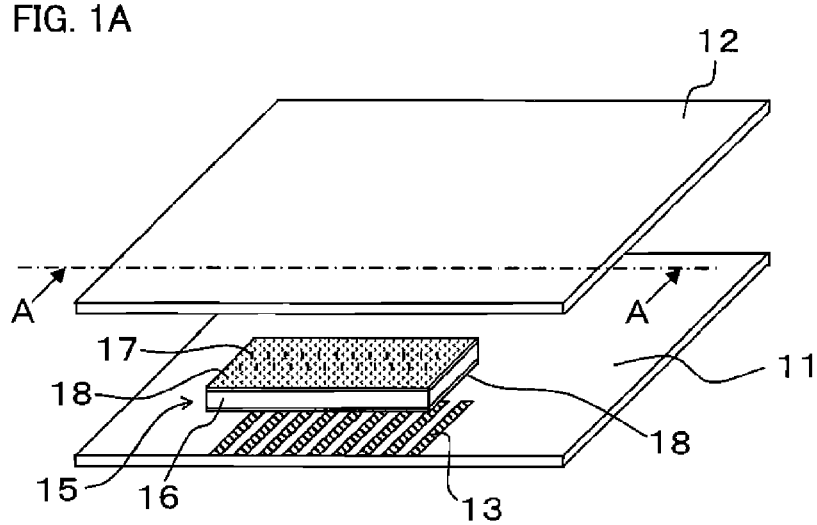
FIGS. 1A to C are process perspective views schematically illustrating manufacturing steps of a circuit board device according to a first exemplary embodiment of the present invention.

DESCRIPTION OF REFERENCE SYMBOLS 1 first module
2 second module
3 mounted part
11, 611 first wiring board
12, 612 second wiring board
13, 14, 613, 614 connecting terminal
15, 615 anisotropic conductive member
16, 616 insulating elastic resin material
16a recess
17, 617 fine metal wires
18 shape-retaining resin (resin layer)
41a, 41b curvature-imparting jig
100 socket
100a opening
101 plug
155b outer lead
156a, 156b flat cable
159a, 159b contact device
202 rigid printed wiring board
205 flexible printed wiring board
210 insulating substrate
211, 213 conductive pattern
211a, 213a land
212 @PEEK
214 solder
215, 216 flexible printed wiring board
301 flexible printed wiring board
302 glass substrate 302
303 ACF
304 heating and pressurizing tool
305 reinforcing tape
305a adhesive
306 conductive particle
307 ITO circuit
308 LCD
309 moisture-proofing reinforcement
310 binder
401 fixing element
402 liquid crystal module
403 flexible printed wiring board
404 electrical connecting member
405 rigid printed wiring board
406 electrode
410 positioning hole
412 fixing tab
414 positioning hole
500a top surface
500b bottom surface
501 connector sheet
511 electrical insulating sheet-like substrate
511a top surface
511b bottom surface
512 adhesive layer
520 conductive member
520a one end
320b other end

PREFERRED MODES FOR CARRYING OUT THE INVENTION

First Exemplary Embodiment

Figure 1B:
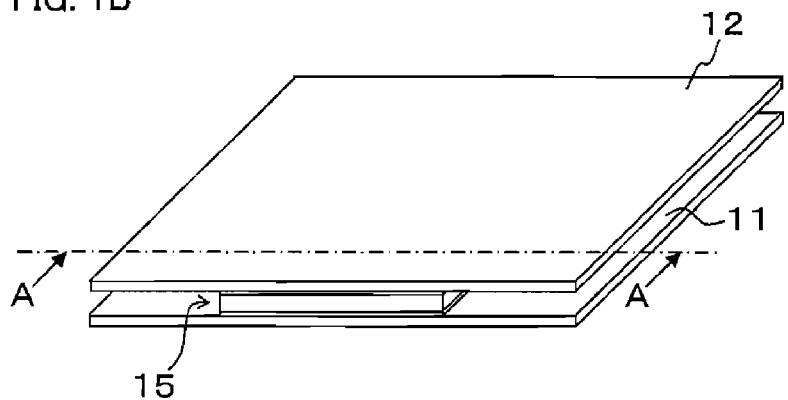
Figure 1C:
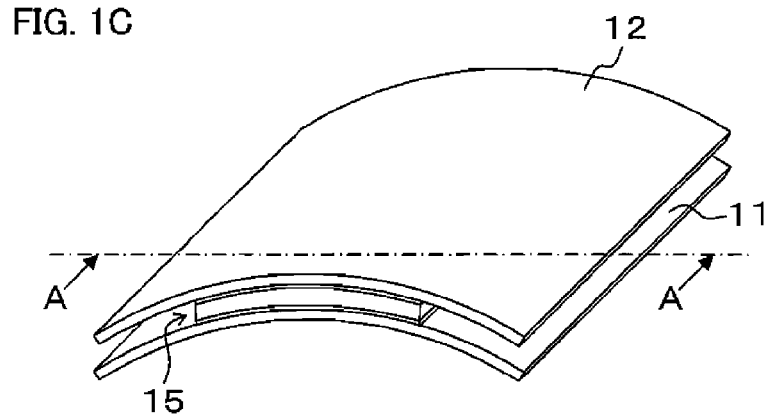
Figure 2A:
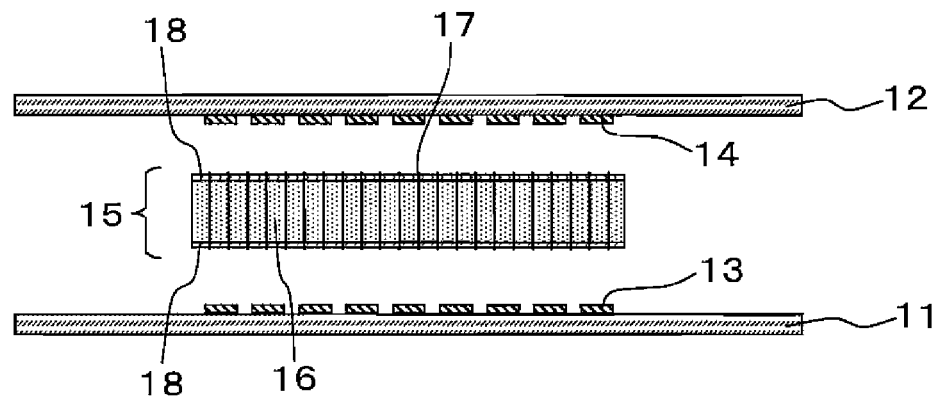
FIGS. 2A to C are sectional views taken along line A-A in FIGS. 1A to C, respectively, schematically illustrating manufacturing steps of a circuit board device according to a first exemplary embodiment of the present invention.
Figure 2B:
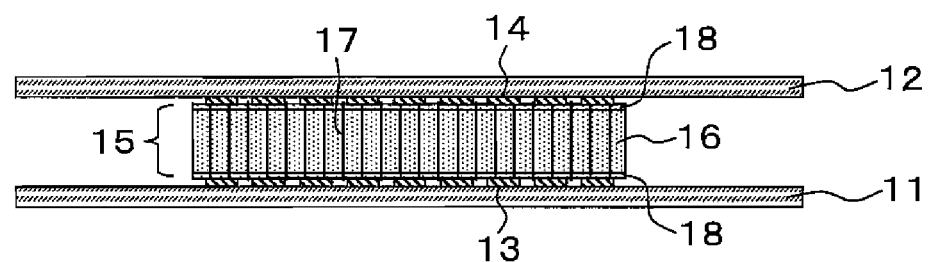
Figure 2C:
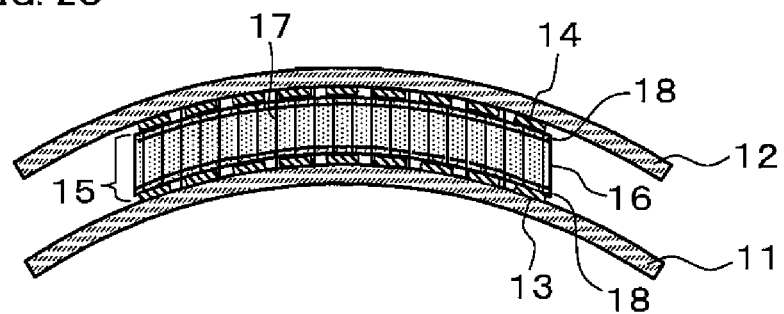
Figure 3A:
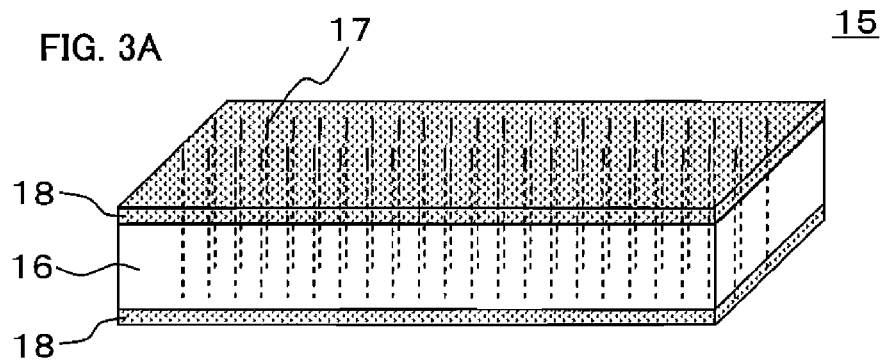
FIGS. 3A to D are a perspective view, front view, plan view and side view, respectively, schematically illustrating construction, before curving, of an anisotropic conductive member in a circuit board device according to a first exemplary embodiment of the present invention.
Figure 3B:
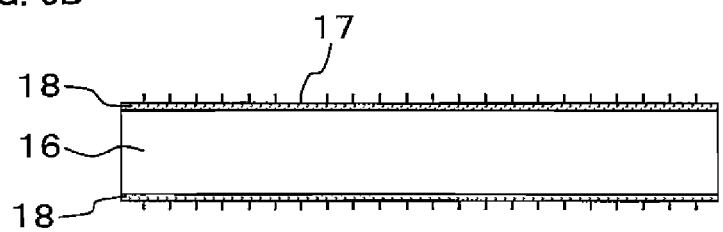
Figure 3C:
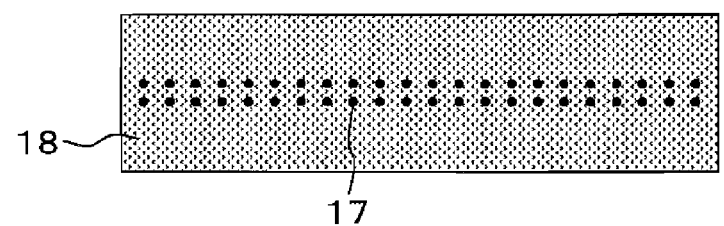
Figure 3D:
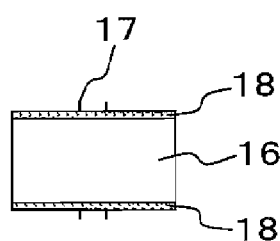

A circuit board device according to a first exemplary embodiment of the present invention will be described with reference to the drawings. FIGS. 1A to C are process perspective views schematically illustrating manufacturing steps of a circuit board device according to a first exemplary embodiment of the present invention; FIGS. 2A to C are sectional views taken along line A-A in FIGS. 1A to C, respectively, schematically illustrating manufacturing steps of a circuit board device according to a first exemplary embodiment of the present invention; FIGS. 3A to (d) are a perspective view, front view, plan view and side view, respectively, schematically illustrating construction, before curving, of an anisotropic conductive member in a circuit board device according to a first exemplary embodiment of the present invention; and FIG. 4 is a graph representing the relationship between deflection amounts δ1 and δα at a rigidity ratio α=1 to 30 in a circuit board device according to a first exemplary embodiment of the present invention. Furthermore, FIGS. 2A, 2B and 2C correspond to FIGS. 1A, 1B and 1C, respectively.

The circuit board device according to the first exemplary embodiment, which is one having a structure in which a plurality of wiring boards are connected together using an anisotropic conductive member, has a first wiring board 11, a second wiring board 12 and an anisotropic conductive member 15.

The first wiring board 11 is a rigid printed wiring board in which metal wiring (e.g., Cu wiring) has been formed on a substrate comprising an insulating resin (e.g., a resin the main raw material of which is FR4). The first wiring board 11 is formed to have connecting terminals 13 on pads of the metal wiring. By way of example, connecting terminal 13 can be obtained by forming an Ni layer to a thickness of 5 μm on an 18-μm-thick Cu layer by electrolytic plating and forming an Au layer to a thickness of 0.5 μm on the Ni layer by flash plating. In the first exemplary embodiment, nine of the terminals are formed at a pitch of 0.5 mm (wiring width: 0.25 mm, wiring spacing: 0.25 mm).

The second wiring board 12, similar to the first wiring board 11, is a rigid printed wiring board in which metal wiring (e.g., Cu wiring) has been formed on a substrate comprising an insulating resin (e.g., a resin the main raw material of which is FR4 [a board formed of epoxy resin-impregnated glass fiber cloth]. The second wiring board 12 is formed to have connecting terminals 14 on pads of the metal wiring at positions opposing to the connecting terminals 13 of the first wiring board 11. By way of example, in a manner similar to that of the connecting terminals 13, connecting terminal 14 can be obtained by forming an Ni layer to a thickness of 5 μm on an 18-μm-thick Cu layer by electrolytic plating and forming an Au layer to a thickness of 0.5 μm on the Ni layer by flash plating. In the first exemplary embodiment, nine of the terminals are formed at a pitch of 0.5 mm (wiring width: 0.25 mm, wiring spacing: 0.25 mm).

The anisotropic conductive member 15 is one having an insulating elastic resin material 16 as a substrate in which fine metal wires 17 are embedded as conductive material. The middle portions of the fine metal wires 17 are embedded in the insulating elastic resin material 16 in such a manner that the fine metal wires 17 will connect the connecting terminals 13 on the first wiring board 11 and the corresponding connecting terminals 14 on the second wiring board 12. Both principal surfaces of the anisotropic conductive member 15 are coated with an insulating shape-retaining resin 18 (resin layer) having a flexural rigidity greater than that of the insulating elastic resin material 16.

With regard to the anisotropic conductive member 15, and by way of example, silicone rubber having a rubber hardness of 50 degrees (JIS-K-6249) can be used as the insulating elastic resin material 16 and a conductive material comprising, e.g., nickel wire having a diameter of 15 μm and surface-treated with Au plating can be used as the fine metal wire 17. The external dimensions of the anisotropic conductive member 15 can be, e.g., width (length): 8 mm, depth (lateral length): 2 mm and thickness: 0.3 mm. Further, the fine metal wires 17 can be arranged at a pitch of 0.25 mm so that there will be 22 rows in the pitch (row) direction of the connecting terminals 13, 14 and two columns in the direction (column direction) that intersects the pitch direction, i.e., 22 rows×2 columns, by way of example. Furthermore, a heat-curable epoxy resin having a curing temperature of 80° C. can be used as the shape-retaining resin 18, by way of example. The thickness of the shape-retaining resin 18 is calculated using "Equation 5" (described later) in such a manner that flexural rigidity Bp of the shape-retaining resin 18 will be, e.g., ten times flexural rigidity Bc of the insulating elastic resin material 16, and the resin layer can be applied to a thickness of 0.027 mm. At this time Young's modulus of the insulating elastic resin material 16 of anisotropic conductive member 15 is 1 MPa, thickness is 0.3 mm and Young's modulus after curing of the shape-retaining resin 18 is 7000 MPa. Furthermore, fine metal wires 17 having a length of 0.39 mm can be used so that they will project from the surface of the shape-retaining resin 18 by 0.015 mm or more.

A method of manufacturing the circuit board device according to the first exemplary embodiment of the present invention will be described next.

First, the first wiring board 11 and second wiring board 12 are positioned precisely by positioning means (not shown) in such a manner that the respective connecting terminals 13, 14 will come into 1:1 correspondence, and the anisotropic conductive member 15 is then placed at a prescribed position between the first wiring board 11 and second wiring board 12 [see FIG. 1A and FIG. 2A].

Next, the anisotropic conductive member 15 is sandwiched between the first wiring board 11 and second wiring board 12, the anisotropic conductive member 15 is pressurized (compressed) by pressurizing means (not shown) and the connecting terminals 13 on the first wiring board 11 and connecting terminals 14 on the second wiring board 12 are connected electrically via the fine metal wires 17 of the anisotropic conductive member 15 [see FIG. 1B and FIG. 2B]. As a result, a repulsive restoration force is produced in the insulating elastic resin material 16 and the repulsive restoration force is utilized to maintain the contact pressure between the fine metal wires 17 and the connecting terminals 13, 14 of the of the wiring boards 11, 12, whereby an electrically connected state is assured. Here the pressurizing force applied by the pressurizing means (not shown) can be made 0.6 N per terminal, by way of example.

Next, the entirety of the first wiring board 11 and second wiring board 12 with the anisotropic conductive member 15 sandwiched between them using the pressurizing means (not shown) is heated by being introduced into a high-temperature chamber at an internal temperature of 90° C., and curvature is imparted by a curvature-imparting jig (not shown) to the first wiring board 11 and second wiring board 12, between which the anisotropic conductive member 15 is sandwiched using the pressurizing means (not shown), in such a manner that a prescribed radius of curvature (e.g., 100 mm) is obtained [see FIG. 1C and FIG. 2C]. At this time the shape-retaining resin 18 (e.g., a heat-curable epoxy resin the curing temperature of which is 80° C.) that has been applied to both principal surfaces of the anisotropic conductive member 15 is cured completely. This is followed by cooling down to room temperature (here 25° C.). As a result, there is obtained a circuit board device possessing a structure in which the first wiring board 11 having a radius of curvature of 100 mm and the second wiring board 12 having a radius of curvature of 100 nm are connected to each other electrically via the anisotropic conductive member 15 having curvature.

Here a method of calculating the thickness of the shape-retaining resin 18 applied to both principal surfaces of the anisotropic conductive member 15 will be described.

From the fundamental equation "Equation 1" for finding the deflection of a beam in strength of materials where r, E, I and M represent the radius of a curvature of a beam, Young's modulus, secondary moment of a cross section and bending moment, respectively, it is understood that curvature 1/r of the deflection curve of the beam is proportional to the bending moment M and inversely proportional to E·I. Here E·I is decided by the physical properties of the material of the beam and the cross-sectional shape thereof. If we let E·I=B hold, define B as flexural rigidity and rewrite "Equation 1", then the result is "Equation 2".

$$1/r = M/EI \qquad \text{[Equation 1]}$$

$$1/r = M/B \qquad \text{[Equation 2]}$$

If we let r represent the radius of curvature after imparting curvature to the first wiring board 11 and second wiring board 12, let Mc represent the bending moment of the insulating elastic resin material 16 of anisotropic conductive member 15 and let Mp represent the bending moment of the shape-retaining resin 18, then the reaction bending moment Mc' that the shape-retaining resin 18 receives from the insulating elastic resin material 16 imparted with curvature conforming to the first wiring board 11 and second wiring board 12 will be the same value as that of the bending moment necessary to impart the curvature radius r to the insulating elastic resin material 16, so that "Mc'=Mc" will hold. It will be understood from "Equation 2" that in order for the curvature of the insulating elastic resin material 16 to be maintained by the shape-retaining resin 18, the shape-retaining resin 18 is required to have a flexural rigidity B large enough so that the deformation thereof will be sufficiently small even if it is acted upon by the reaction bending moment Mc' (=Mc=Mp).

Flexural rigidity Bc of the insulating elastic resin material 16 and flexural rigidity Bp of the shape-retaining resin 18 are as shown in "Equation 3" and "Equation 4", respectively, where Ec, Ic, b and dc represent Young's modulus, secondary moment of the cross section, the width (length) dimension and the thickness, respectively, of the insulating elastic resin material 16 of anisotropic conductive member 15, and Ep, Ip, b and dp represent Young's modulus, secondary moment of the cross section, the width (length) dimension and the thickness, respectively, of the shape-retaining resin 18.

$$Bc = Ec \times b \cdot dc^3/12 \quad \text{[Equation 3]}$$

$$Bp = 2 \times Ep \times b \cdot dp^3/12 \quad \text{[Equation 4]}$$

In view of "Equation 3" and "Equation 4", the thickness dp of shape-retaining resin 18 for which the bending (flexural) moment Bp of shape-retaining resin 18 will be α times the bending moment Bc of insulating elastic resin material 16 is as shown in "Equation 5".

$$dp = dc \times (\alpha/2 \times Ec/Ep)^{1/3} \quad \text{[Equation 5]}$$

It is obvious from "Equation 2" that if flexural rigidity B is a factor of α, then the curvature thereof is a factor of 1/α (the radius of curvature is a factor of α).

If L is the length of a beam, then the deflection amount δ is as expressed by "Equation 6" and, in view of FIG. 4 representing the relationship between δ1 and δα at α=1 to 30, it will be understood that δα/δ1 is a hyperbola with respect to α. In other words, when α is 10 or greater, δα/δ1 is less than 10%. Hence the value is sufficient for the curvature of the insulating elastic resin material 16 to be maintained by the shape-retaining resin 18.

$$\delta = \alpha r \{1 - \cos[L/(2\alpha r)]\} \quad \text{[Equation 6]}$$

In accordance with the first exemplary embodiment, the shape of both principal surfaces of anisotropic conductive member 15 is defined by the shape-retaining resin 18. As a result, a force in the shearing direction ascribable to the restoration force of the insulating elastic resin material 16 will not act upon the surface of contact between connecting terminals 13, 14 of the first wiring board 11 and second wiring board 12 and the fine metal wires 17 disposed in the anisotropic conductive member 15, and a decline in contact pressure and a positional deviation between the connecting terminals 13, 14 and fine metal wires 17 no longer occur. This makes it possible to realize a circuit board device that exhibits highly stable DC electrical resistance values without electrical problems such as open connections and shorts.

It should be noted that although rigid printed wiring boards having FR4 as the substrate are used as the first wiring board 11 and second wiring board 12 in the first exemplary embodiment, the invention is not limited to this arrangement. It does not matter if a flexible printed wiring board having polyimide as the substrate is used or if use is made of rigid printed wiring boards and flexible printed wiring boards in any combination.

Further, in the first exemplary embodiment, a circuit board device possessing a structure in which two wiring boards having curvature are connected to each other electrically via the anisotropic conductive member 15 is formed. However, this does not impose a limitation upon the invention and it is possible to realize a circuit board device possessing a structure in which three or more wiring boards having curvature are connected to one another electrically via anisotropic conductive members 15.

Further, in the first exemplary embodiment, the anisotropic conductive member 15 employs silicone rubber having a rubber hardness of 50 degrees (JIS-K-6249) as the insulating elastic resin material 16. However, similar effects are obtained if the rubber hardness ranges from 20 degrees to 80 degrees.

Further, in the first exemplary embodiment, a conductive material comprising nickel wire having a diameter of 15 μm and surface-treated with Au plating is used as the fine metal wire 17. However, any one among gold wire, copper wire, brass wire, phosphor bronze wire, stainless-steel wire and tungsten wire may be used and similar results are obtained if the diameter thereof ranges from φ5 μm to φ20 μm.

Further, in the first exemplary embodiment, the shape-retaining resin 18 also employs a heat-curable epoxy resin having a curing temperature of 80° C. However, this does not impose a limitation upon the invention. If the resin is a heat-curable (thermo setting) resin (e.g., a synthetic resin the main raw material of which is epoxy resin; melamine resin or a synthetic resin the main raw material of which is melamine resin; or an unsaturated polyester resin or a synthetic resin the main raw material of which is unsaturated polyester resin, etc.) the curing temperature of which is lower than the heat-resistance temperature of the insulating elastic resin material 16 of anisotropic conductive member 15, then it can be used by similarly optimizing the thickness thereof using "Equation 5".

Second Exemplary Embodiment

A circuit board device according to a second exemplary embodiment of the present invention will be described. It should be noted that the drawings and the construction of the first wiring board 11 and second wiring board 12 are similar to those of the first exemplary embodiment and need not be described again.

The circuit board device according to the second exemplary embodiment differs from that of the first exemplary embodiment in that a thermoplastic resin is chosen for the shape-retaining resin 18. This exemplary embodiment is similar to the first exemplary embodiment in other respects.

A thermoplastic polyethylene resin having a softening temperature of 105° C. can be used as the shape-retaining resin 18, by way of example. The thickness of the shape-retaining resin 18 is calculated using "Equation 5" in such a manner that the flexural rigidity Bp of the shape-retaining resin 18 will be ten times the flexural rigidity Bc of the insulating elastic resin material 16, and the resin layer can be applied to a thickness of 0.047 mm. At this time Young's modulus of the insulating elastic resin material 16 of anisotropic conductive member 15 is 1 MPa, thickness is 0.3 mm and Young's modulus after curing of the shape-retaining resin 18 is 1300 MPa. Fine metal wires 17 having a length of 0.43 mm can be used so that they will project from the surface of the shape-retaining resin 18 by 0.015 mm or more.

A method of manufacturing the circuit board device according to the second exemplary embodiment of the present invention will be described next.

First, the first wiring board 11 and second wiring board 12 are positioned precisely by positioning means (not shown) in such a manner that the respective connecting terminals 13, 14 will come into 1:1 correspondence, and the anisotropic conductive member 15 is then placed at a prescribed position between the first wiring board 11 and second wiring board 12 [see FIG. 1A and FIG. 2A].

Next, the anisotropic conductive member 15 is sandwiched between the first wiring board 11 and second wiring board 12, the anisotropic conductive member 15 is pressurized (compressed) by pressurizing means (not shown) and the connecting terminals 13 on the first wiring board 11 and connecting terminals 14 on the second wiring board 12 are connected electrically via the fine metal wires 17 of the anisotropic conductive member 15 [see FIG. 1A and FIG. 2B]. As a result, a repulsive restoration force is produced in the insulating elastic resin material 16 and the repulsive restoration force is utilized to maintain the contact pressure between the fine metal wires 17 and the connecting terminals 13, 14 of the of the wiring boards 11, 12, whereby an electrically connected state is assured. Here the pressurizing force applied by the pressurizing means (not shown) can be made 0.6 N per terminal, by way of example.

Next, the entirety of the first wiring board 11 and second wiring board 12 with the anisotropic conductive member 15 sandwiched between them using the pressurizing means (not shown) is heated by being introduced into a high-temperature chamber at an internal temperature of 115° C., and curvature is imparted by a curvature-imparting jig (not shown) to the first wiring board 11 and second wiring board 12, between which the anisotropic conductive member 15 is sandwiched using the pressurizing means (not shown), in such a manner that a prescribed radius of curvature (e.g., 100 mm) is obtained [see FIG. 1C and FIG. 2C]. At this time the shape-retaining resin 18 (e.g., a thermoplastic polyethylene resin the softening temperature of which is 105° C.) that has been applied to both principal surfaces of the anisotropic conductive member 15 is softened completely. This is followed by cooling down to room temperature (here 25° C.), whereby the shape-retaining resin 18 comprising the thermoplastic polyethylene resin hardens completely. As a result, there is obtained a circuit board device possessing a structure in which the first wiring board 11 having a radius of curvature of 100 mm and the second wiring board 12 having a radius of curvature of 100 mm are connected to each other electrically via the anisotropic conductive member 15 having curvature.

In accordance with the second exemplary embodiment, as compared with the first exemplary embodiment, a thermoplastic resin is selected and applied rather than a heat-curable resin as the shape-retaining resin 18 on both principal surfaces of the insulating elastic resin material 16 of anisotropic conductive member 15. As a result, it is possible to implement a heating and bending process performed by being divided into two or more or a plurality of cycles, and this allows a larger curvature to be imparted.

It should be noted that although a thermoplastic polyethylene resin having a softening temperature of 105° C. is used as the shape-retaining resin 18 of anisotropic conductive member 15 in the second exemplary embodiment, this does not impose a limitation upon the present invention. If the resin is a thermoplastic resin (e.g., a synthetic resin the main raw material of which is polyethylene resin, or polyvinyl chloride or a synthetic resin the main raw material of which is polyvinyl chloride, etc.) the softening temperature of which is lower than the heat-resistance temperature of the insulating elastic resin material 16 of anisotropic conductive member 15, then it can be used by similarly optimizing the thickness thereof using "Equation 5".

Other effects are similar to those of the first exemplary embodiment.

Third Exemplary Embodiment

Figure 5A:
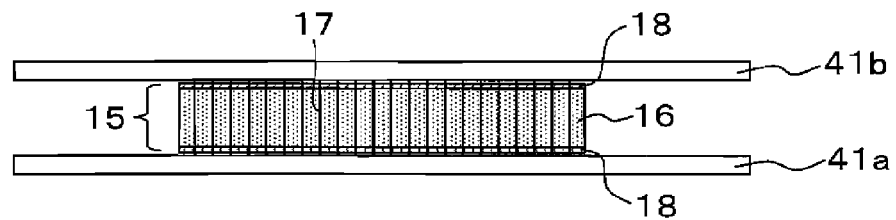
FIGS. 5A to C are first process perspective views schematically illustrating manufacturing steps of a circuit board device according to a third exemplary embodiment of the present invention.
Figure 5B:
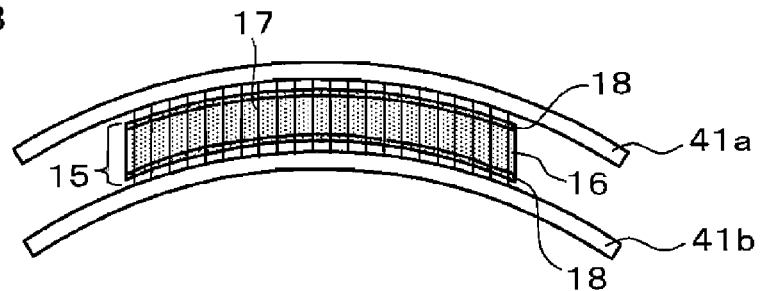
Figure 5C:
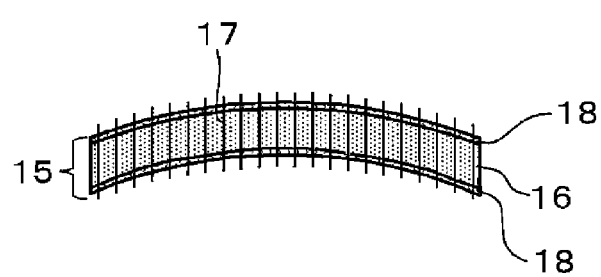
Figure 6A:
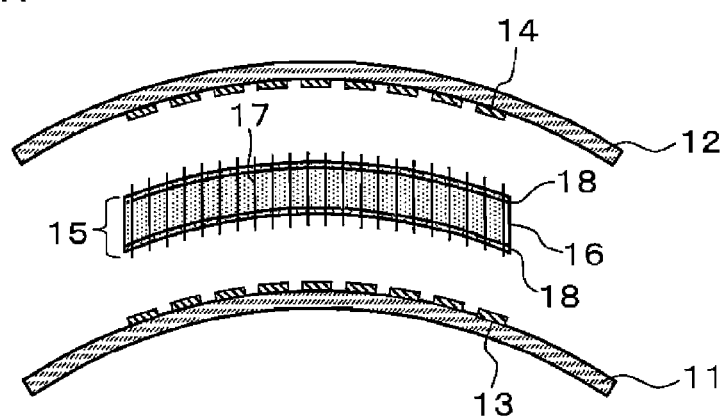
FIGS. 6A and B are second process perspective views schematically illustrating manufacturing steps of a circuit board device according to a third exemplary embodiment of the present invention.

A circuit board device according to a second exemplary embodiment of the present invention will be described. FIGS. 5 and 6 are process perspective views schematically illustrating manufacturing steps of a circuit board device according to a third exemplary embodiment of the present invention. Furthermore, FIGS. 5A to C relate to steps for imparting curvature of an anisotropic conductive member, and FIGS. 6A and B relate to assembly steps.

The circuit board device according to the third exemplary embodiment, which is one having a structure in which a plurality of wiring boards are connected together using an anisotropic conductive member, has the first wiring board 11, the second wiring board 12 and the anisotropic conductive member 15.

The first wiring board 11 is a rigid printed wiring board in which metal wiring (e.g., Cu wiring) has been formed on a substrate comprising an insulating resin (e.g., a resin the main raw material of which is FR4). The first wiring board 11 is formed to have connecting terminals 13 on pads of the metal wiring. By way of example, connecting terminal 13 can be obtained by forming an Ni layer by electrolytic plating to a thickness of 5 μm on an 18-μm-thick Cu layer and forming an Au layer to a thickness of 0.5 μm on the Ni layer by flash plating. In the third exemplary embodiment, nine of the terminals are formed at a pitch of 0.5 mm (wiring width: 0.25 mm, wiring spacing: 0.25 mm).

The second wiring board 12, similar to the first wiring board 11, is a rigid printed wiring board in which metal wiring (e.g., Cu wiring) has been formed on a substrate comprising an insulating resin (e.g., a resin the main raw material of which is FR4). The second wiring board 12 is formed to have connecting terminals 14 on pads of the metal wiring at positions opposing the connecting terminals 13 of the first wiring board 11. By way of example, in a manner similar to that of the connecting terminals 13, connecting terminal 14 can be obtained by forming an Ni layer to a thickness of 5 μm on an 18-μm-thick Cu layer by electrolytic plating and forming an Au layer to a thickness of 0.5 μm on the Ni layer by flash plating. In the third exemplary embodiment, nine of the terminals are formed at a pitch of 0.5 mm (wiring width: 0.25 mm, wiring spacing: 0.25 mm).

Here the first wiring board 11 and second wiring board 12 are heated in a high-temperature chamber and each is imparted with curvature by curvature-imparting means (not shown) before assembly in such a manner that the radius of curvature will be 100 mm.

The anisotropic conductive member 15 is one having insulating elastic resin material 16 as a substrate in which fine metal wires 17 are embedded as conductive material. The middle portions of the fine metal wires 17 are embedded in the insulating elastic resin material 16 in such a manner that the fine metal wires 17 will connect the connecting terminals 13 on the first wiring board 11 and the corresponding connecting terminals 14 on the second wiring board 12. Both principal surfaces of the anisotropic conductive member 15 are coated with an insulating shape-retaining resin 18 comprising thermoplastic resin.

With regard to the anisotropic conductive member 15, and by way of example, silicone rubber having a rubber hardness of 50 degrees (JIS-K-6249) can be used as the insulating elastic resin material 16 and a conductive material comprising nickel wire having a diameter of 15 μm and surface-treated with Au plating can be used as the fine metal wire 17. The external dimensions of the anisotropic conductive member 15 can be, e.g., width (length): 8 mm, depth (lateral length): 2 mm and thickness: 0.3 mm. Further, the fine metal wires 17 can be arranged at a pitch of 0.25 mm so that there will be 22 rows in the pitch (row) direction of the connecting terminals 13, 14 and two columns in the direction (column direction) that intersects the pitch direction, i.e., 22 rows×2 columns, by way of example. Furthermore, a heat-curable epoxy resin having a curing temperature of 80° C. can be used as the shape-retaining resin 18, by way of example. The thickness of the shape-retaining resin 18 is calculated using "Equation 5" in such a manner that the flexural rigidity Bp of the shape-retaining resin 18 will be, e.g., ten times the flexural rigidity Bc of the insulating elastic resin material 16, and the resin layer can be applied to a thickness of 0.027 mm. At this time Young's modulus of the insulating elastic resin material 16 of anisotropic conductive member 15 is 1 MPa, thickness is 0.3 mm and Young's modulus after curing of the shape-retaining resin 18 is 7000 MPa. Furthermore, fine metal wires 17 having a length of 0.39 mm can be used so that they will project from the surface of the shape-retaining resin 18 by 0.015 mm or more.

A method of manufacturing the circuit board device according to the third exemplary embodiment of the present invention will be described next. Here the method of manufacture is for a case where curvature is imparted to each of the wiring boards in advance before the first wiring board 11 and second wiring board 12 are combined.

First, the flat anisotropic conductive member 15 is clamped between flat curvature-imparting jigs 41a, 41b at an applied pressure of 0.6 N per terminal [see FIG. 5A].

Next, while the anisotropic conductive member 15 clamped between the curvature-imparting jigs 41a, 41b is heated in a high-temperature chamber at an internal temperature of 90° C., curvature is imparted by the curvature-imparting jigs 41a, 41b in such a manner that the radius of curvature takes on a value of 100 mm [see FIG. 5B]. As a result, the shape-retaining resin 18 (heat-curable epoxy resin having a curing temperature of 80° C.) that has been applied to both principal surfaces of the anisotropic conductive member 15 also is cured completely. This is followed by cooling down to room temperature (here 25° C.) and separating the curvature-imparting jigs 41a, 41b, whereby the curved anisotropic conductive member 15 having a radius of curvature of 100 mm shown in FIG. 5C is fabricated.

Thereafter, the first wiring board 11 previously imparted with curvature and the second wiring board 12 previously imparted with curvature are positioned precisely by positioning means (not shown) in such a manner that the respective connecting terminals 13, 14 will come into 1:1 correspondence, and the anisotropic conductive member 15 previously imparted with curvature is then placed at a prescribed position between the first wiring board 11 and second wiring board 12 [see FIG. 6A].

Figure 6B:
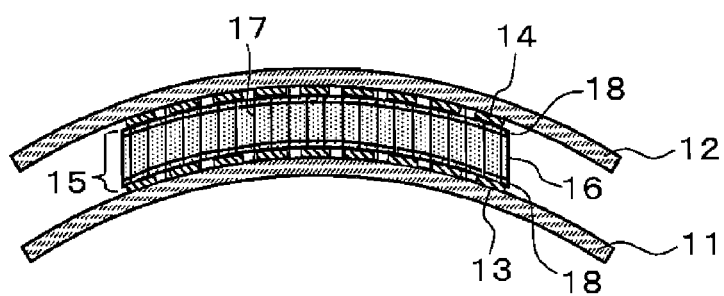

Next, the anisotropic conductive member 15 is sandwiched between the first wiring board 11 and second wiring board 12, the anisotropic conductive member 15 is compressed by pressurizing means (not shown) at an applied pressure of 0.6N per terminal and the connecting terminals 13 on the first wiring board 11 and connecting terminals 14 on the second wiring board 12 are connected electrically [see FIG. 6B]. Thus there is obtained a circuit board device possessing a structure in which the first wiring board 11 having curvature and the second wiring board 12 having curvature are connected together electrically via the anisotropic conductive member 15 having curvature. As a result, a repulsive restoration force is produced in the insulating elastic resin material 16 and the repulsive restoration force is utilized to maintain the contact pressure between the fine metal wires 17 and the connecting terminals 13, 14 of the of the wiring boards 11, 12, whereby an electrically connected state is assured. In this way there is obtained a circuit board device possessing a structure in which the first wiring board 11 having a radius of curvature of 100 mm and the second wiring board 12 having a radius of curvature of 100 mm are connected together electrically via the anisotropic conductive member 15 having curvature.

In accordance with the first exemplary embodiment, the shape of both principal surfaces of anisotropic conductive member 15 is defined by the shape-retaining resin 18. As a result, a force in the shearing direction ascribable to the restoration force of the insulating elastic resin material 16 will not act upon the surface of contact between connecting terminals 13, 14 of the first wiring board 11 and second wiring board 12 and the fine metal wires 17 disposed in the anisotropic conductive member 15, and a decline in contact pressure and a positional deviation between the connecting terminals 13, 14 and fine metal wires 17 no longer occur. This makes it possible to realize a circuit board device that exhibits highly stable DC electrical resistance values without electrical problems such as open connections and shorts.

Further, in accordance with the third exemplary embodiment, it is possible to impart both principal surfaces of the anisotropic conductive member 15 with separate curvatures at will by imparting the curvature-imparting jig 41a corresponding to the first wiring board 11 and the curvature-imparting jig 41a corresponding to the second wiring board 12 with separate curvatures at will, and there can be obtained a circuit board device possessing a structure in which the first wiring board 11 and second wiring board 12 having individual curvatures are connected together electrically via the anisotropic conductive member 15.

It should be noted that although rigid printed wiring boards having FR4 as the substrate are used as the first wiring board 11 and second wiring board 12 in the third exemplary embodiment, the invention is not limited to this arrangement. It does not matter if a flexible printed wiring board having polyimide as the substrate is used or if use is made of rigid printed wiring boards and flexible printed wiring boards in any combination.

Further, in the third exemplary embodiment, a circuit board device possessing a structure in which two wiring boards having curvature are connected to each other electrically via the anisotropic conductive member 15 is formed. However, this does not impose a limitation upon the invention and it is possible to realize a circuit board device possessing a structure in which three or more wiring boards having curvature are connected to one another electrically via anisotropic conductive members 15.

Further, in the third exemplary embodiment, the anisotropic conductive member 15 employs silicone rubber having a rubber hardness of 50 degrees (JIS-K-6249) as the insulating elastic resin material 16. However, similar effects are obtained if the rubber hardness ranges from 20 degrees to 80 degrees.

Further, in the third exemplary embodiment, a conductive material comprising nickel wire having a diameter of 15 μm and surface-treated with Au plating is used as the fine metal wire 17. However, any one among gold wire, copper wire, brass wire, phosphor bronze wire, stainless-steel wire and tungsten wire may be used and similar results are obtained if the diameter thereof ranges from φ5 μm to φ20 μm.

Further, in the third exemplary embodiment, the shape-retaining resin 18 also employs a heat-curable epoxy resin having a curing temperature of 80° C. However, this does not impose a limitation upon the invention. If the resin is a heat-curable resin (e.g., a synthetic resin the main raw material of which is epoxy resin; melamine resin or a synthetic resin the main raw material of which is melamine resin; or an unsaturated polyester resin or a synthetic resin the main raw material of which is unsaturated polyester resin, etc.) the curing temperature of which is lower than the heat-resistance temperature of the insulating elastic resin material 16 of anisotropic conductive member 15, then it can be used by similarly optimizing the thickness thereof using "Equation 5".

Fourth Exemplary Embodiment

A circuit board device according to a fourth exemplary embodiment of the present invention will be described. It should be noted that the drawings and the construction of the first wiring board 11 and second wiring board 12 are similar to those of the third exemplary embodiment and need not be described again.

The circuit board device according to the fourth exemplary embodiment differs from that of the third exemplary embodiment in that a thermoplastic resin is chosen for the shape-retaining resin 18. This exemplary embodiment is similar to the third exemplary embodiment in other respects.

A thermoplastic polyethylene resin having a softening temperature of 105° C. can be used as the shape-retaining resin 18. The thickness of the shape-retaining resin 18 is calculated using "Equation 5" in such a manner that the flexural rigidity Bp of the shape-retaining resin 18 will be ten times the flexural rigidity Bc of the insulating elastic resin material 16, and the resin layer can be applied to a thickness of 0.047 mm. At this time Young's modulus of the insulating elastic resin material 16 of anisotropic conductive member 15 is 1 MPa, thickness is 0.3 mm and Young's modulus after curing of the shape-retaining resin 18 is 1300 MPa. Fine metal wires 17 having a length of 0.43 mm can be used so that they will project from the surface of the shape-retaining resin 18 by 0.015 mm or more.

A method of manufacturing the circuit board device according to the fourth exemplary embodiment of the present invention will be described next.

First, the flat anisotropic conductive member 15 is clamped between the flat curvature-imparting jigs 41a, 41b at an applied pressure of 0.6 N per terminal [see FIG. 5A].

Next, while the anisotropic conductive member 15 clamped between the curvature-imparting jigs 41a, 41b is heated in a high-temperature chamber at an internal temperature of 115° C., curvature is imparted by the curvature-imparting jigs 41a, 41b in such a manner that the radius of curvature takes on a value of 100 mm [see FIG. 5B]. As a result, the shape-retaining resin 18 (thermoplastic polyethylene resin having a softening temperature of 80° C.) that has been applied to both principal surfaces of the anisotropic conductive member 15 is softened completely. This is followed by cooling down to room temperature (here 25° C.), whereby the shape-retaining resin 18 comprising the thermoplastic polyethylene resin hardens completely, and separating the curvature-imparting jigs 41a, 41b, whereby the curved anisotropic conductive member 15 having a radius of curvature of 100 mm shown in FIG. 5C is fabricated.

Thereafter, the first wiring board 11 previously imparted with curvature and the second wiring board 12 previously imparted with curvature are positioned precisely by positioning means (not shown) in such a manner that the respective connecting terminals 13, 14 will come into 1:1 correspondence, and the anisotropic conductive member 15 previously imparted with curvature is then placed at a prescribed position between the first wiring board 11 and second wiring board 12 [see FIG. 6A].

Next, the anisotropic conductive member 15 is sandwiched between the first wiring board 11 and second wiring board 12, the anisotropic conductive member 15 is compressed by pressurizing means (not shown) at an applied pressure of 0.6N per terminal and the connecting terminals 13 on the first wiring board 11 and connecting terminals 14 on the second wiring board 12 are connected electrically [see FIG. 6B]. Thus there is obtained a circuit board device possessing a structure in which the first wiring board 11 having curvature and the second wiring board 12 having curvature are connected together electrically via the anisotropic conductive member 15 having curvature. As a result, a repulsive restoration force is produced in the insulating elastic resin material 16 and the repulsive restoration force is utilized to maintain the contact pressure between the fine metal wires 17 and the connecting terminals 13, 14 of the of the wiring boards 11, 12, whereby an electrically connected state is assured. In this way there is obtained a circuit board device possessing a structure in which the first wiring board 11 having a radius of curvature of 100 mm and the second wiring board 12 having a radius of curvature of 100 mm are connected together electrically via the anisotropic conductive member 15 having curvature.

In accordance with the fourth exemplary embodiment, as compared with the third exemplary embodiment, a thermoplastic resin is selected and applied rather than a heat-curable resin as the shape-retaining resin 18 on both principal surfaces of the insulating elastic resin material 16 of anisotropic conductive member 15. As a result, it is possible to implement a re-heating and bending process. This makes it possible to impart greater curvature or, conversely, to reduce curvature in a circuit board device possessing a structure in which the first wiring board 11 having curvature and the second wiring board 12 having curvature are connected to each other electrically via the anisotropic conductive member 15.

It should be noted that although a thermoplastic polyethylene resin having a softening temperature of 105° C. is used as the shape-retaining resin 18 of anisotropic conductive member 15 in the fourth exemplary embodiment, this does not impose a limitation upon the present invention. If the resin is a thermoplastic resin (e.g., a synthetic resin the main raw material of which is polyethylene resin, or polyvinyl chloride or a synthetic resin the main raw material of which is polyvinyl chloride, etc.) the softening temperature of which is lower than the heat-resistance temperature of the insulating elastic resin material 16 of anisotropic conductive member 15, then it can be used by similarly optimizing the thickness thereof using "Equation 5".

Other effects are similar to those of the third exemplary embodiment.

Fifth Exemplary Embodiment

A circuit board device according to a fifth exemplary embodiment of the present invention will be described. It should be noted that the drawings and the construction of the first wiring board 11 and second wiring board 12 are similar to those of the third exemplary embodiment and need not be described again.

The circuit board device according to the fifth exemplary embodiment differs from those of the third and fourth exemplary embodiments in that an ultraviolet-curable resin is chosen for the shape-retaining resin 18. This exemplary embodiment is similar to the third exemplary embodiment in other respects.

An ultraviolet-curable epoxy acrylate resin can be used as the shape-retaining resin 18, by way of example. The thickness of the shape-retaining resin 18 is calculated using "Equation 5" in such a manner that the flexural rigidity Bp of the shape-retaining resin 18 will be ten times the flexural rigidity Bc of the insulating elastic resin material 16, and the resin layer can be applied to a thickness of 0.052 mm. At this time Young's modulus of the insulating elastic resin material 16 of anisotropic conductive member 15 is 1 MPa, thickness is 0.3 mm and Young's modulus after curing of the shape-retaining resin 18 is 1000 MPa. Furthermore, fine metal wires 17 having a length of 0.44 mm can be used so that they will project from the surface of the shape-retaining resin 18 by 0.015 mm or more.

A method of manufacturing the circuit board device according to the fifth exemplary embodiment of the present invention will be described next.

First, the flat anisotropic conductive member 15 is clamped between the flat curvature-imparting jigs 41a, 41b at an applied pressure of 0.6 N per terminal [see FIG. 5A].

Next, the anisotropic conductive member 15 clamped between the curvature-imparting jigs 41a, 41b is imparted with curvature by the curvature-imparting jigs 41a, 41b in such a manner that the radius of curvature takes on a value of 100 mm, after which the anisotropic conductive member is irradiated with ultraviolet light having a wavelength of 300 nm [see FIG. 5B]. As a result, the shape-retaining resin 18 comprising the ultraviolet-curable epoxy acrylate resin that has been applied to both principal surfaces of the anisotropic conductive member 15 also is cured completely. By separating the curvature-imparting jigs 41a, 41b, the anisotropic conductive member 15 having a radius of curvature of 100 mm shown in FIG. 5C is fabricated.

Thereafter, the first wiring board 11 previously imparted with curvature and the second wiring board 12 previously imparted with curvature are positioned precisely by positioning means (not shown) in such a manner that the respective connecting terminals 13, 14 will come into 1:1 correspondence, and the anisotropic conductive member 15 previously imparted with curvature is then placed at a prescribed position between the first wiring board 11 and second wiring board 12 [see FIG. 6A].

Next, the anisotropic conductive member 15 is sandwiched between the first wiring board 11 and second wiring board 12, the anisotropic conductive member 15 is compressed by pressurizing means (not shown) at an applied pressure of 0.6N per terminal and the connecting terminals 13 on the first wiring board 11 and connecting terminals 14 on the second wiring board 12 are connected electrically [see FIG. 6B]. Thus there is obtained a circuit board device possessing a structure in which the first wiring board 11 having curvature and the second wiring board 12 having curvature are connected together electrically via the anisotropic conductive member 15 having curvature. As a result, a repulsive restoration force is produced in the insulating elastic resin material 16 and the repulsive restoration force is utilized to maintain the contact pressure between the fine metal wires 17 and the connecting terminals 13, 14 of the of the wiring boards 11, 12, whereby an electrically connected state is assured. In this way there is obtained a circuit board device possessing a structure in which the first wiring board 11 having a radius of curvature of 100 mm and the second wiring board 12 having a radius of curvature of 100 mm are connected together electrically via the anisotropic conductive member 15 having curvature.

In accordance with the fifth exemplary embodiment, as compared with the third and fourth exemplary embodiments, an ultraviolet-curable resin is selected and applied rather than a heat-curable resin as the shape-retaining resin 18 on both principal surfaces of the insulating elastic resin material 16 of anisotropic conductive member 15. When the anisotropic conductive member 15 is imparted with curvature, therefore, a heating step is unnecessary and the quality of the insulating elastic resin material 16 of anisotropic conductive member 15 can be prevented from being altered by a history of heating (thermal history).

It should be noted that although an ultraviolet-curable epoxy acrylate resin is used as the shape-retaining resin 18 of anisotropic conductive member 15 in the fifth exemplary embodiment, this does not impose a limitation upon the present invention. If the resin is an ultraviolet-curable resin such as a synthetic resin the main raw material of which is epoxy acrylate resin, or urethane acrylate resin or a synthetic resin the main raw material of which is urethane acrylate resin, by way of example, then it can be used by similarly optimizing the thickness thereof using "Equation 5".

Other effects are similar to those of the third exemplary embodiment.

Sixth Exemplary Embodiment

Figure 7A:
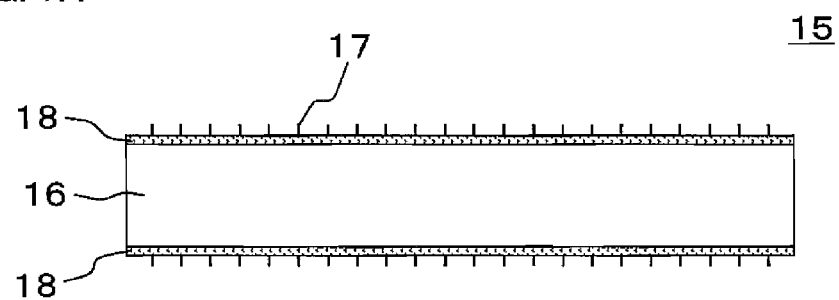
FIGS. 7A, B and C are a front view, plan view and side view, respectively, of three views in the third angle projection method schematically illustrating a first construction, before curving, of an anisotropic conductive member in a circuit board device according to a sixth exemplary embodiment of the present invention.
Figure 8A:
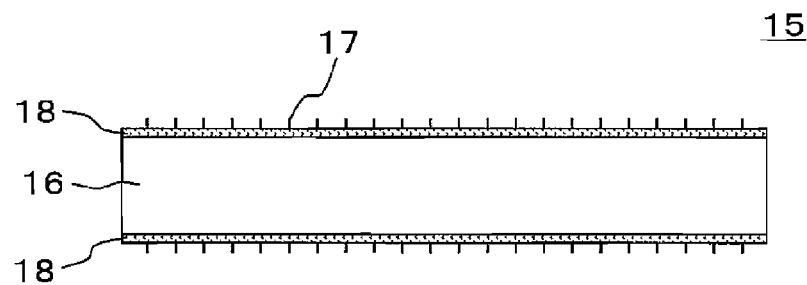
FIGS. 8A, B and C are a front view, plan view and side view, respectively, of three views in the third angle projection method schematically illustrating a second construction, before curving, of an anisotropic conductive member in a circuit board device according to a sixth exemplary embodiment of the present invention.

A circuit board device according to a sixth exemplary embodiment of the present invention will be described. FIGS. 7A, B and C are a front view, top plan view and side view, respectively, of three views in the third angle projection method schematically illustrating a first formulation, before curving, of an anisotropic conductive member in a circuit board device according to a sixth exemplary embodiment of the present invention. FIGS. 8A, B and C are a front view, plan view and side view, respectively, of three views in the third angle projection method schematically illustrating a second formulation, before curving, of an anisotropic conductive member in a circuit board device according to a sixth exemplary embodiment of the present invention.

The circuit board device according to the sixth exemplary embodiment differs from those of the first to fifth exemplary embodiments in that the shape-retaining resin 18 on both principal surfaces of the insulating elastic resin material 16 of anisotropic conductive member 15 is applied not to the entire surfaces of the principal surfaces but to a part thereof, or more specifically, at locations other than the area in which the fine metal wires have been disposed. This exemplary embodiment is similar to the first to fifth exemplary embodiments in other respects.

Figure 7B:
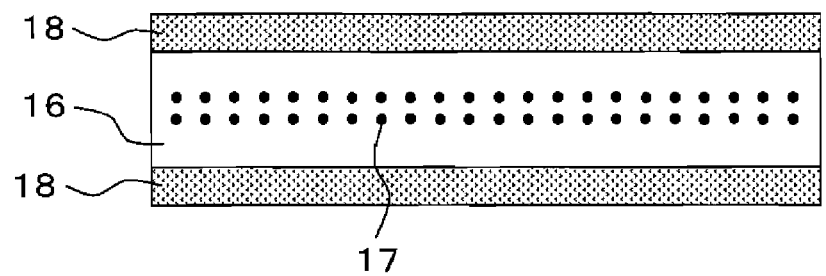
Figure 7C:
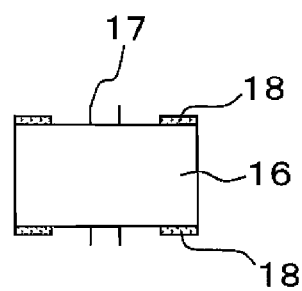

With reference to FIG. 7, the shape-retaining resin 18 is applied to both principal surfaces of the insulating elastic resin material 16 of anisotropic conductive member 15 in two lines along the long sides, or in the proximity thereof, of the anisotropic conductive member 15. If we let Ec, be and dc represent Young's modulus, the width (length) dimension and thickness, respectively, of the insulating elastic resin material 16 and let Ep, bop and dp represent Young's modulus, the width (length) dimension and thickness, respectively, of the shape-retaining resin 18, then thickness dp of shape-retaining resin 18 for which the flexural rigidity Bp of shape-retaining resin 18 will be a times the flexural rigidity Bc of insulating elastic resin material 16 is as shown in "Equation 7".

$$dp = dc \times (\alpha/4 \times Ec/Ep \times bc/bp)^{1/3} \qquad \text{[Equation 7]}$$

With regard to working of the sixth exemplary embodiment, it goes without saying that it is necessary to optimize this thickness using "Equation 7" in accordance with the insulating elastic resin material 16 and the properties and shape of the shape-retaining resin 18 in a manner similar to the first to fifth exemplary embodiments.

In accordance with the sixth exemplary embodiment, as compared with the first to fifth exemplary embodiments, the shape-retaining resin 18 on both principal surfaces of the insulating elastic resin material 16 of anisotropic conductive member 15 is applied not to the entire surfaces of the principal surfaces but to a part thereof, or more specifically, at locations other than the area in which the fine metal wires have been disposed. This makes it possible to realize a circuit board device in which the stability of DC electric resistance values is enhanced and in which faulty contact, which is ascribable to sandwiching of the shape-retaining resin 18 between fine metal wires 17 and the connecting terminals 13, 14 of the first wiring board 11 and second wiring board 12, respectively, does not readily occur.

Figure 8B:
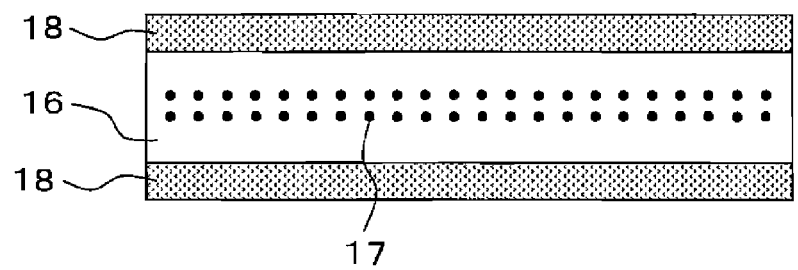
Figure 8C:
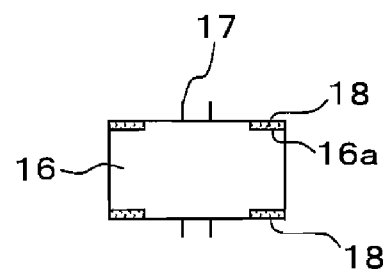

As a modification of the sixth exemplary embodiment, recesses 16a (stepped portions are also permissible) may be formed in both principal surfaces of the insulating elastic resin material 16 of anisotropic conductive member 15, and the shape-retaining resin 18 may be applied in the recesses 16a, as illustrated in FIG. 8. In this case, the external shape of the anisotropic conductive member 15 can be decided without any dependence upon the type of resin chosen for the shape-retaining resin 18 and rather than the conductive members (fine metal wires 17) being projected from both principal surfaces of the insulating elastic resin material 16 of anisotropic conductive member 15, it is possible to apply and use an anisotropic conductive material (not shown) that employs metal particles (as exemplified by Au particles, Ag particles, Ni particles, Cu particles, Au plating particles, Ag plating particles, Ni plating particles or Cu plating particles, etc.) instead.

Other effects are similar to those of the first to fifth exemplary embodiments.

Seventh Exemplary Embodiment

Figure 9A:
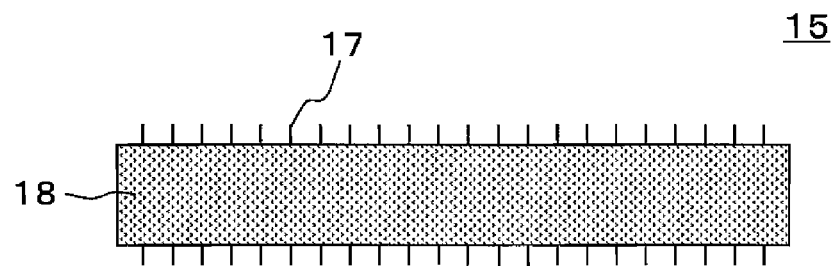
FIGS. 9A, B and C are a front view, plan view and side view, respectively, of three views in the third angle projection method schematically illustrating a first construction, before curving, of an anisotropic conductive member in a circuit board device according to a seventh exemplary embodiment of the present invention.
Figure 10A:
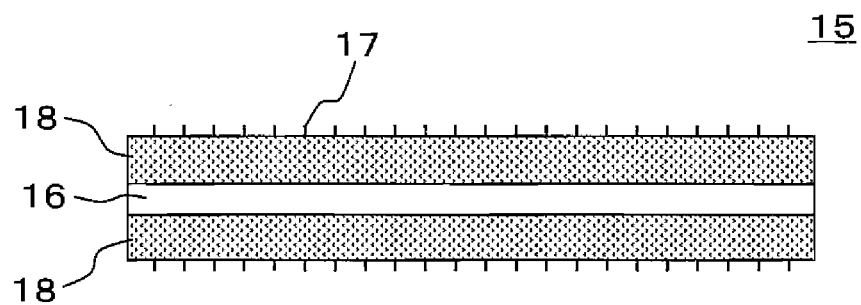
FIGS. 10A, B and C are a front view, plan view and side view, respectively, of three views in the third angle projection method schematically illustrating a second construction, before curving, of an anisotropic conductive member in a circuit board device according to a seventh exemplary embodiment of the present invention.

A circuit board device according to a seventh exemplary embodiment of the present invention will be described with reference to the drawings. FIGS. 9A, B and C are a front view, plan view and side view, respectively, of three views in the third angle projection method schematically illustrating a first formulation, before curving, of an anisotropic conductive member in a circuit board device according to a seventh exemplary embodiment of the present invention. FIGS. 10A, B and C are a front view, top plan view and side view, respectively, of three views in the third angle projection method schematically illustrating a second formulation, before curving, of an anisotropic conductive member in a circuit board device according to a seventh exemplary embodiment of the present invention.

The circuit board device according to the seventh exemplary embodiment differs from those of the first to fifth exemplary embodiments in that the shape-retaining resin 18 on both principal surfaces of the insulating elastic resin material 16 of anisotropic conductive member 15 is applied not to the principal surfaces but to all or part of the side faces in the direction of the long side. This exemplary embodiment is similar to the first to fifth exemplary embodiments in other respects.

Figure 9B:
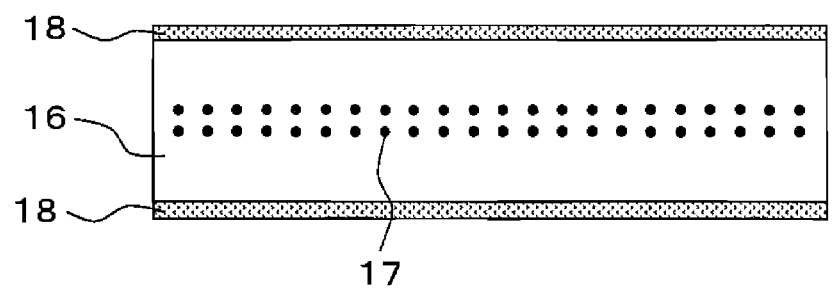
Figure 9C:
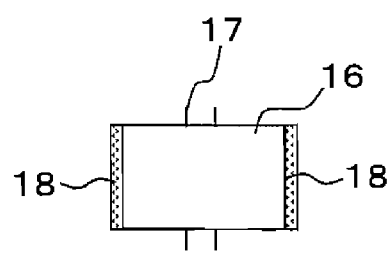

With reference to FIG. 9, the shape-retaining resin 18 is applied to the entirety of both side faces of the insulating elastic resin material 16 of anisotropic conductive member 15 in the direction of the long side. If we let Ec, bc and dc represent Young's modulus, the width (length) dimension and thickness, respectively, of the insulating elastic resin material 16 and let Ep, by and dp represent Young's modulus, the width (length) dimension and thickness, respectively, of the shape-retaining resin 18, then width by of shape-retaining resin 18 for which the flexural rigidity Bp of shape-retaining resin 18 will be a times the flexural rigidity Bc of insulating elastic resin material 16 is as shown in "Equation 8".

$$bp = bc \times \alpha/2 \times Ec/Ep \quad \text{[Equation 8]}$$

With regard to working of the seventh exemplary embodiment, it goes without saying that it is necessary to optimize the thickness and width using "Equation 8" in accordance with the insulating elastic resin material 16 and the properties and shape of shape-retaining resin 18.

Figure 10B:
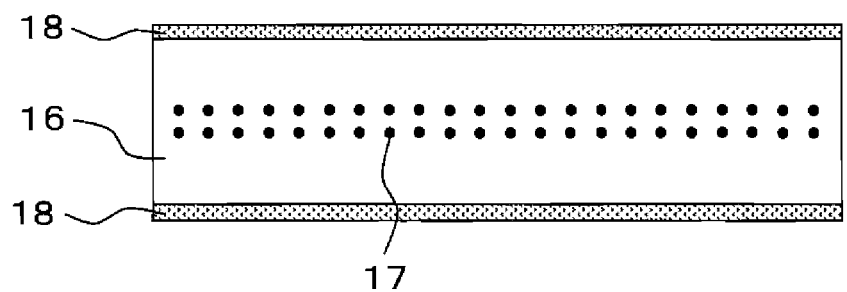
Figure 10C:
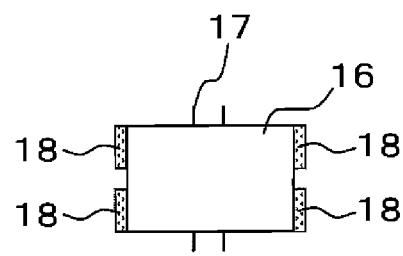

As a modification of the seventh exemplary embodiment, the shape-retaining resin 18 on both side faces of the insulating elastic resin material 16 may be applied not to the entire surfaces of the side faces but to a part thereof, or more specifically, in two lines along the long sides, or in the proximity thereof, of the anisotropic conductive member 15, as illustrated in FIG. 10. If we let Ec, bc and dc represent Young's modulus, the width (length) dimension and thickness, respectively, of the insulating elastic resin material 16 and let Ep, by and dp represent Young's modulus, the width (length) dimension and thickness, respectively, of the shape-retaining resin 18, then width (length) by of shape-retaining resin 18 for which the flexural rigidity Bp of shape-retaining resin 18 will be a times the flexural rigidity Bc of insulating elastic resin material 16 is as shown in "Equation 9".

$$bp = bc \times \alpha/4 \times Ec/Ep \times (dc/dp)^3 \quad \text{[Equation 9]}$$

With regard to working of the seventh exemplary embodiment, it goes without saying that it is necessary to optimize thickness and width (length) using "Equation 9" in accordance with the insulating elastic resin material 16 and the properties and shape of the shape-retaining resin 18.

Other effects are similar to those of the sixth exemplary embodiment.

Eighth Exemplary Embodiment

Figure 11:
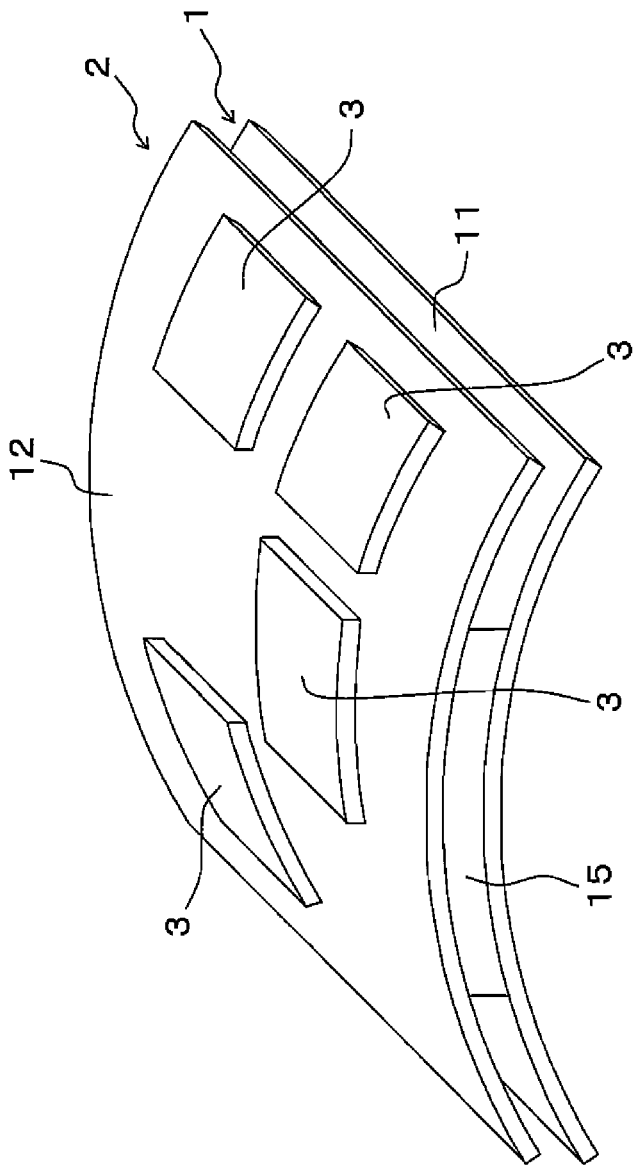
FIG. 11 is a perspective view schematically illustrating the construction of a circuit board module device according to an eighth exemplary embodiment of the present invention.
Figure 12:
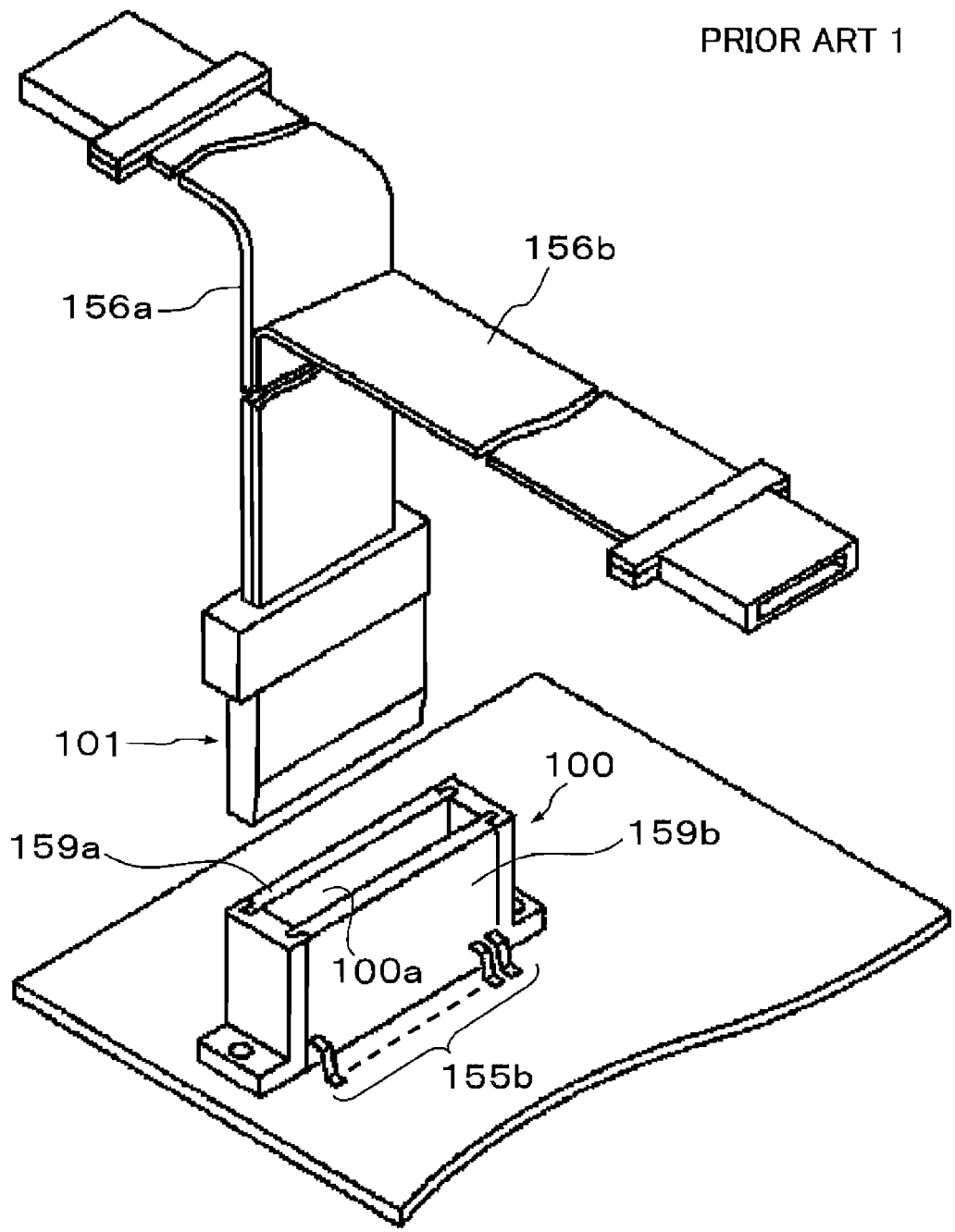
FIG. 12 is a developed partial perspective view schematically illustrating the construction of a circuit board device according to Prior Art 1.
Figure 13:
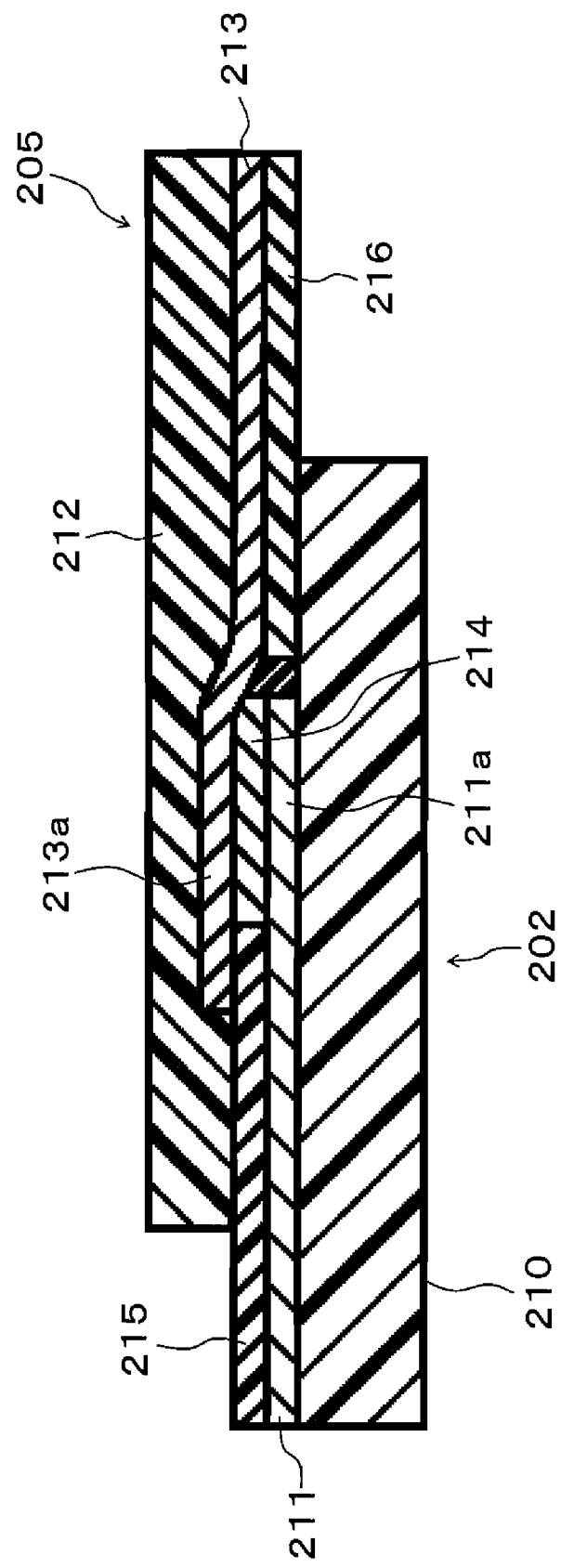
FIG. 13 is a sectional view schematically illustrating the construction of a circuit board device according to Prior Art 2.
Figure 14:
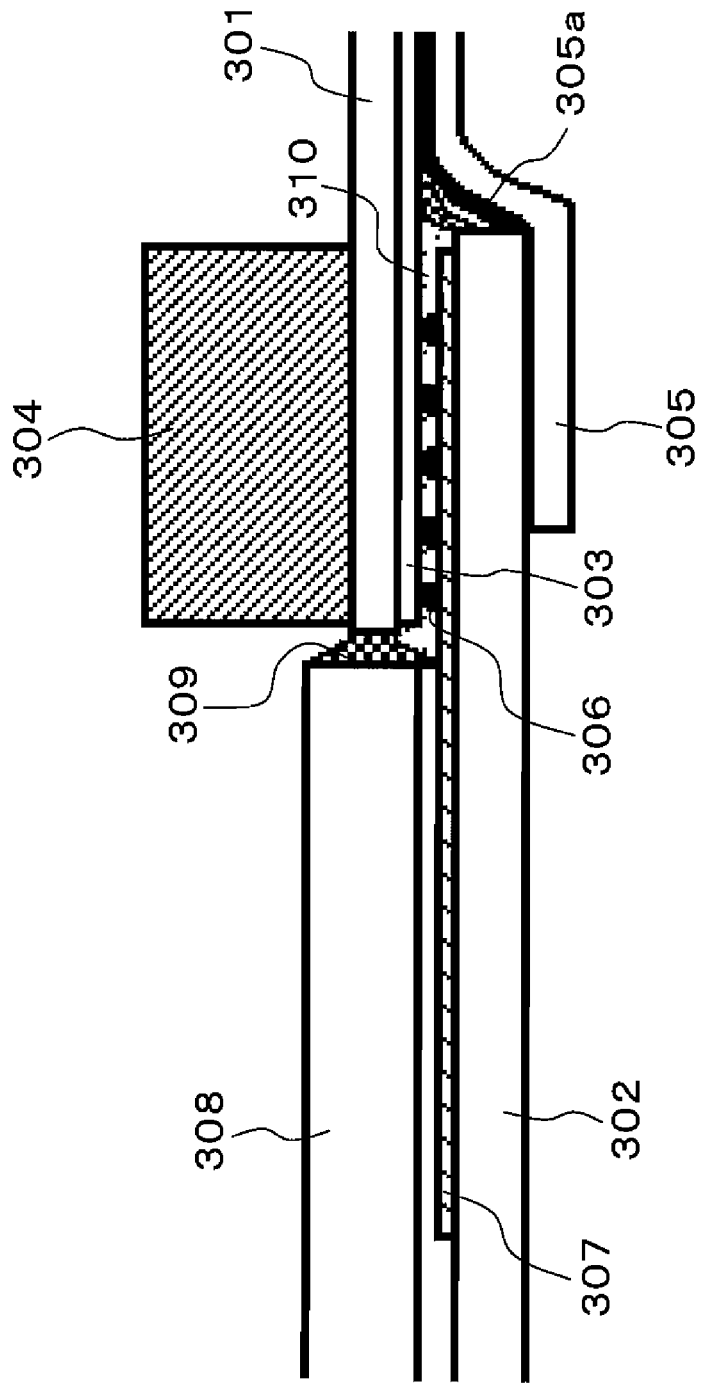
FIG. 14 is a partial sectional view schematically illustrating the construction of a circuit board device according to Prior Art 3.
Figure 15:
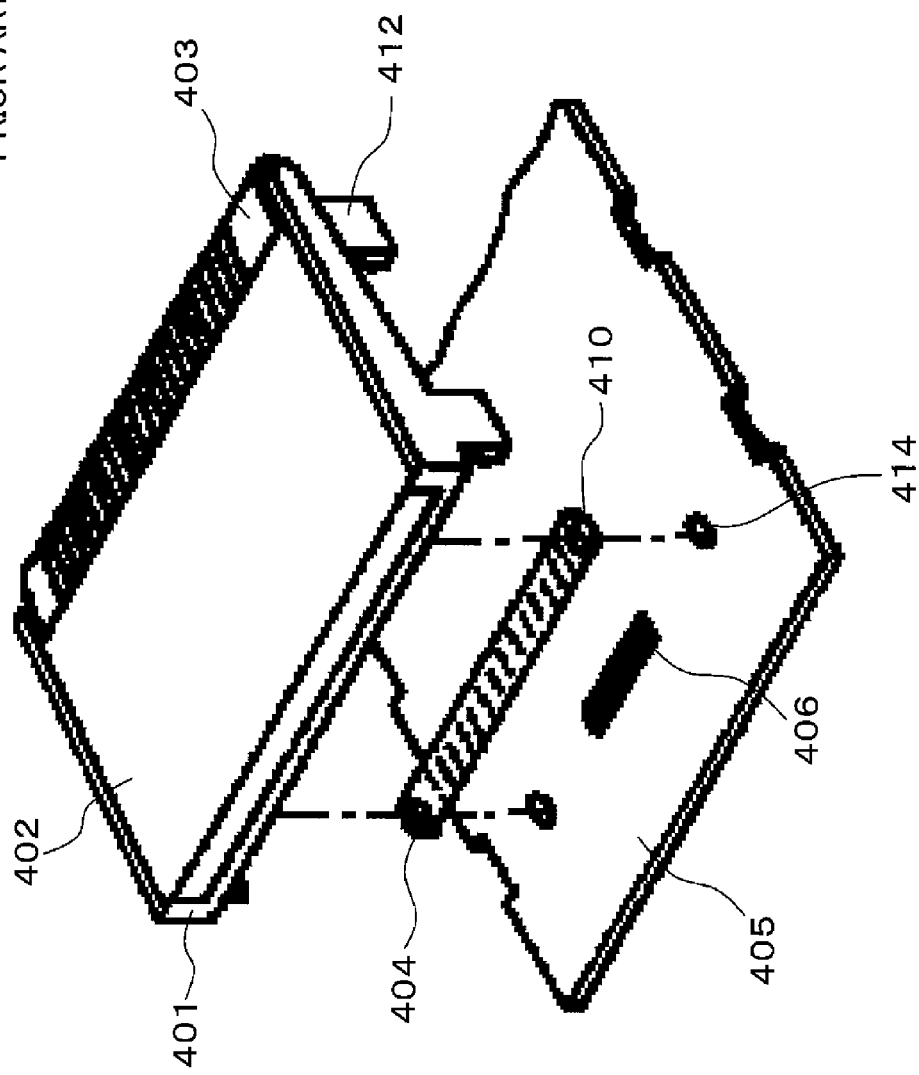
FIG. 15 is a developed perspective view schematically illustrating the construction of a circuit board device according to Prior Art 4.
Figure 16:
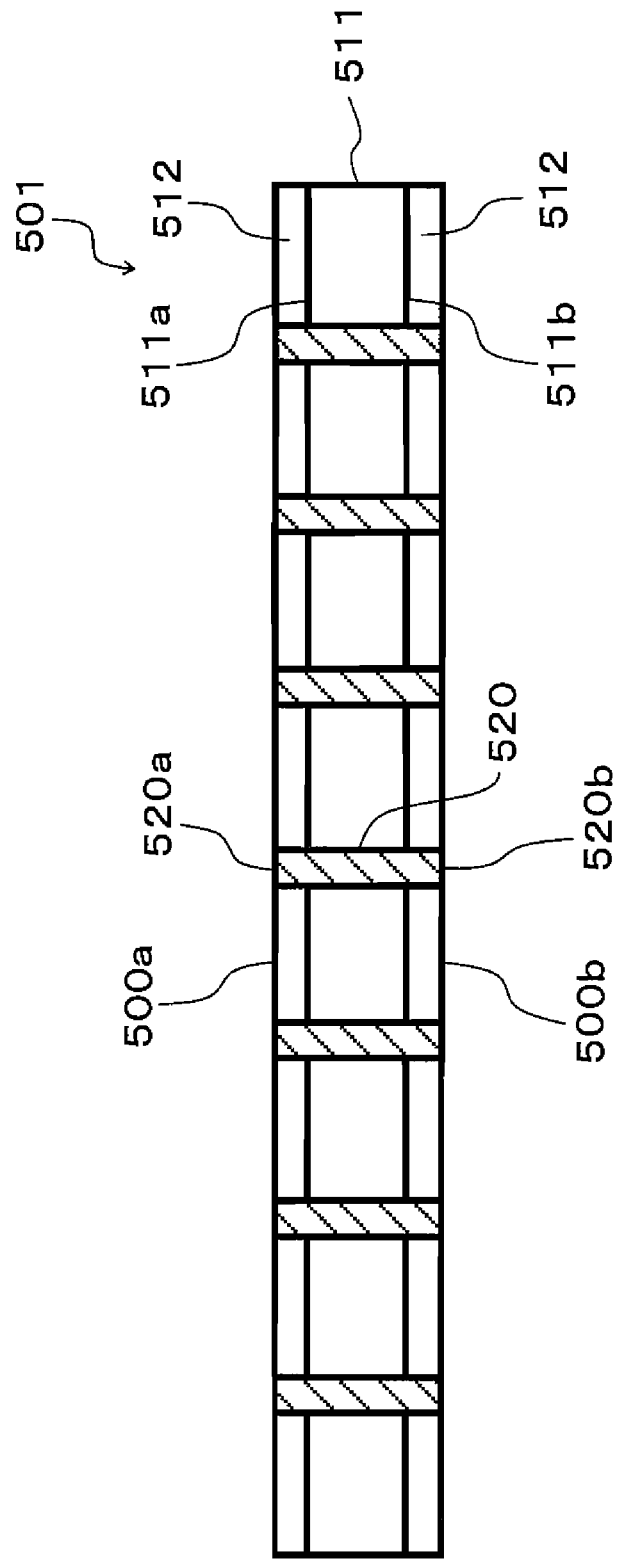
FIG. 16 is a sectional view schematically illustrating the construction of a circuit board device according to Prior Art 5.
Figure 17A:
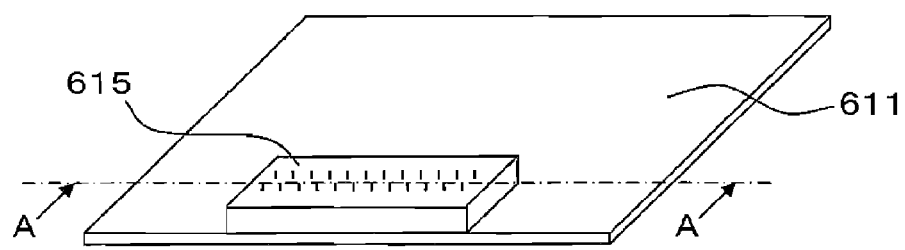
FIGS. 17A to C are process perspective views for describing the problem of a circuit board device according to Prior Art 4.
Figure 17B:
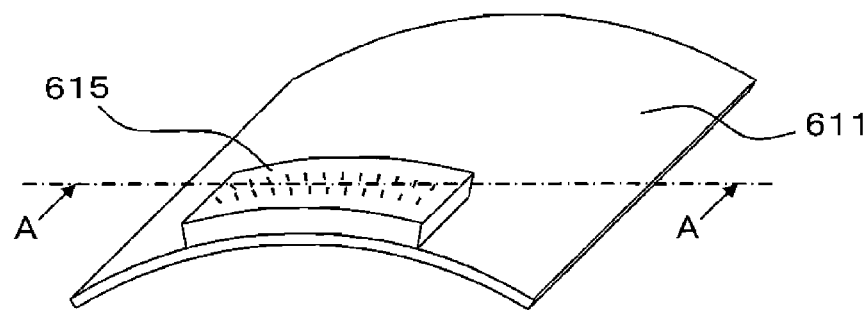
Figure 17C:
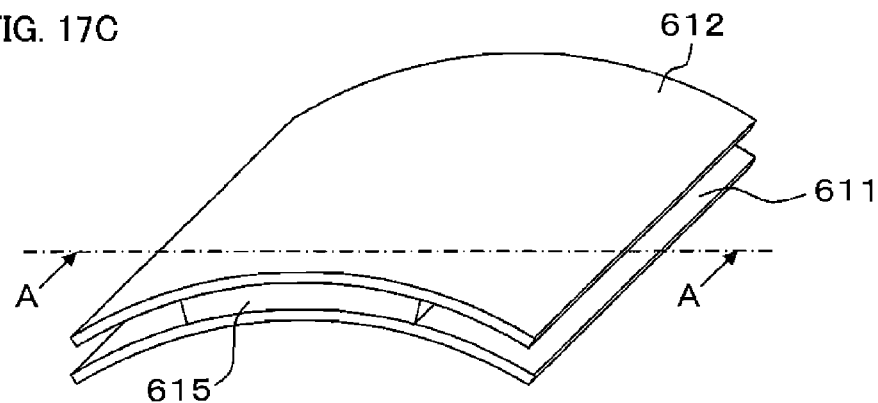
Figure 18A:
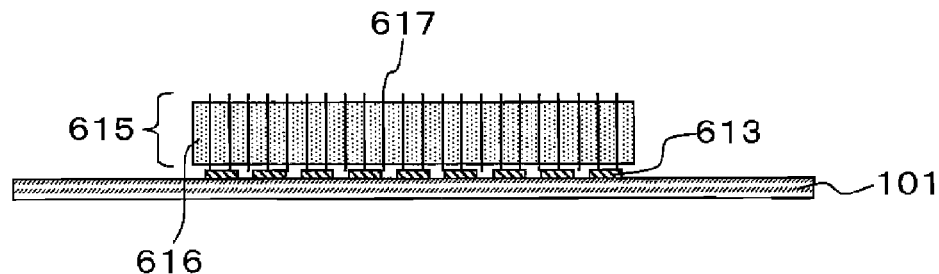
FIGS. 18A to C are sectional views taken along line A-A of FIGS. 17A to C, respectively, for describing the problem of a circuit board device according to Prior Art 4.
Figure 18B:
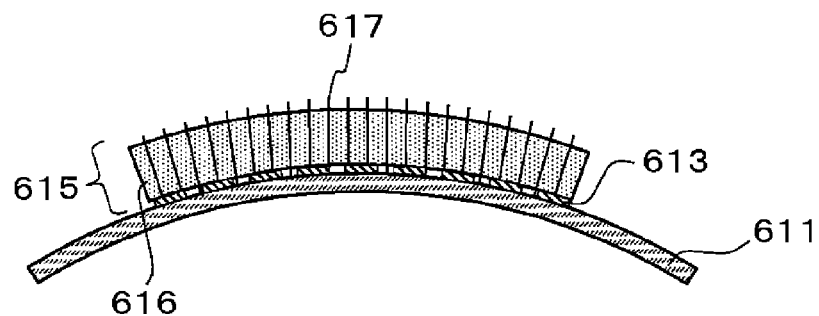
Figure 18C:
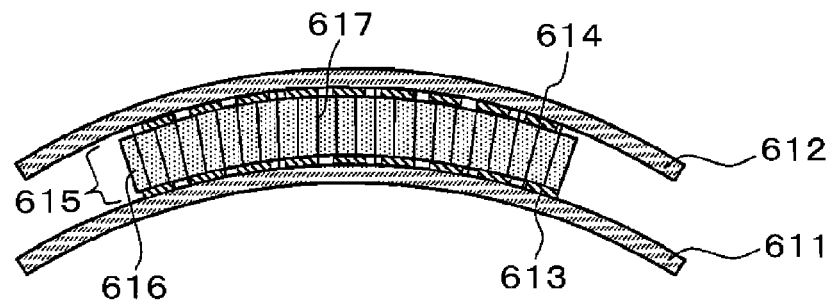
Figure 19A:
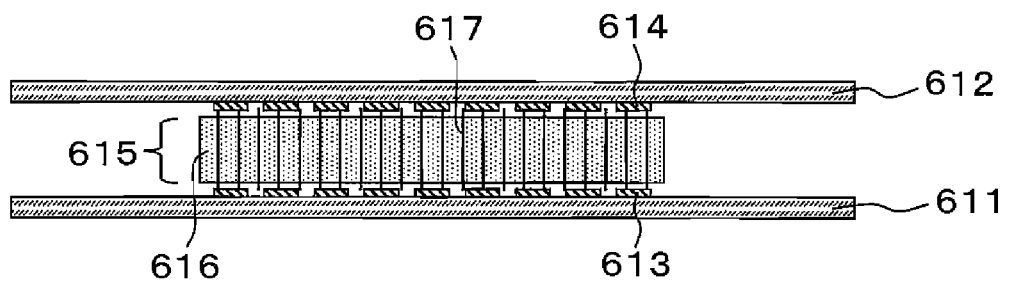
FIGS. 19A and B are process sectional views for describing the problem of a circuit board device according to Prior Art 4.
Figure 19B:
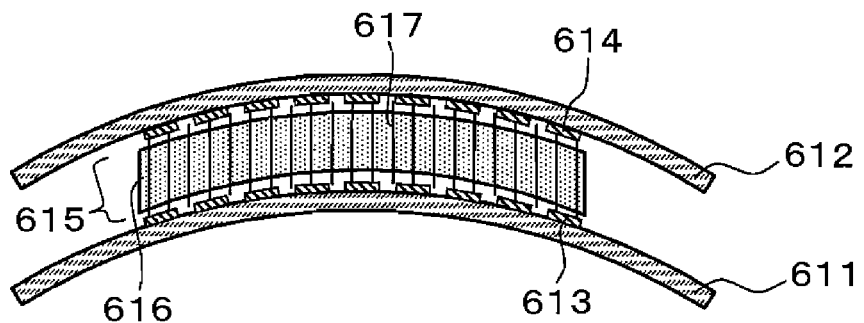

A circuit board module device according to an eighth exemplary embodiment of the present invention will be described with reference to the drawings. FIG. 11 is a perspective view schematically illustrating the construction of a circuit board module device according to an eighth exemplary embodiment of the present invention The circuit board module device according to the eighth exemplary embodiment is obtained by surface-mounting mounted components 3 such as LSI chips (large-scale integrated circuits) on the first wiring board 11 and second wiring board 12 in a circuit board device having a structure identical with that described in the first exemplary embodiment, by way of example. A first module 1 in which mounted components (not shown; components similar to the mounted components 3) are surface-mounted on the first wiring board 11, and which has curvature, and a second module 2 in which the mounted components 3 are surface-mounted on the second wiring board 12, and which has curvature, are connected to each other electrically via the anisotropic conductive member 15.

In accordance with the eighth exemplary embodiment, in a manner similar to that of the first exemplary embodiment, it is possible to realize a circuit board module device that exhibits highly stable DC electrical resistance values without electrical problems such as open connections and shorts. It should be noted that although the eighth exemplary embodiment is premised upon the construction of the first exemplary embodiment, this does not impose any limitation; similar effects can be obtained even if the structure of any one of the second to seventh exemplary embodiments is selected.

Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention.

The invention claimed is:

1. A circuit board device in which a plurality of wiring boards are electrically connected together using an anisotropic conductive member disposed between said plurality of wiring boards, wherein said anisotropic conductive member comprises: an insulating elastic resin material; fine metal wires having a middle portion embedded within said insulating elastic resin material so as to connect corresponding connecting terminals of said plurality of wiring boards; a plurality of resin layers exhibiting a flexural rigidity greater than that of said insulating elastic resin material; wherein an assembly of said plurality of wiring boards and said anisotropic conductive member is curve; wherein said anisotropic conductive member has said resin layers on entire or a portion of opposing side faces other than the principle surfaces that oppose said plurality of wiring boards; and wherein said resin layers comprise at least one resin from among a heat curable resin, thermoplastic resin and ultraviolet curable resin; wherein said resin layers are shape-retaining resins for maintaining curvature of respective ones of principle surfaces of said anisotropic conductive members made to conform to curvature of said plurality of wiring boards; and wherein thickness of the shape-retaining resins is optimized in accordance with the insulating elastic resin material and the properties and shape of the shape-retaining resins.

2. A circuit board device according to claim 1, wherein overall flexural rigidity of said resin layers is ten or more times a flexural rigidity of said insulating elastic resin material.

3. A circuit board device according to claim 1, wherein said device is formed by connecting said plurality of wiring boards, which are flat, together electrically using said anisotropic conductive member, which is flat, and thereafter curving principal surfaces of the assembly of said plurality of wiring boards and said anisotropic conductive member.

4. A circuit board device according to claim 1, wherein said device is formed by sandwiching said anisotropic conductive member, which has a curvature beforehand in principal surfaces, between said plurality of wiring boards, which have a curvature beforehand, in principal surfaces.

5. A circuit board device according to claim 1, wherein thickness of the shape-retaining resins is calculated on basis of Young's modulus Ec and width dimension be and thickness dc and flexible rigidity Bc respectively, of the insulating elastic resin material and Young's modulus Ep and width dimension by and flexural rigidity Bp respectively, of the shape-retaining resins.

6. A circuit board device according to claim 1, wherein thickness of the shape-retaining resins is calculated on basis of the following formula F1 and F2:

$$dp = dc \times (\alpha/4 \times Ec/Ep \times bc/bp)^{1/3} \quad [F1]$$

$$\alpha = Bp/Bc. \quad [F2]$$

7. A circuit board device in which a plurality of wiring boards are electrically connected together using an anisotropic conductive member disposed between said plurality of wiring boards, wherein said anisotropic conductive member comprises: an insulating elastic resin material; fine metal wires having a middle portion embedded within said insulating elastic resin material so as to connect corresponding connecting terminals of said plurality of wiring boards; and a plurality of resin layers exhibiting a flexural rigidity greater than that of said insulating elastic resin material; wherein an assembly of said plurality of wiring boards and said anisotropic conductive member is curve; wherein said anisotropic conductive member has said resin layers partially at locations other than an area in which are disposed said fine metal wires on respective ones of the principal surfaces that oppose said plurality of wiring boards; and wherein said resin layers comprise at least one resin from among a heat curable resin, thermoplastic resin and ultraviolet curable resin; wherein said resin layers are shape-retaining resins for maintaining curvature of respective ones of principal surfaces of said anisotropic conductive member made to conform to curvature of said plurality of wiring boards; and wherein thickness of the shape-retaining resins is optimized in accordance with the insulating elastic resin material and the properties and shape of the shape-retaining resins.

8. A circuit board module device in which a plurality of modules are electrically connected together using an anisotropic conductive member disposed between said plurality of modules, each module having one or a plurality of mounted components surface-mounted on a wiring board, wherein said anisotropic conductive member comprises: an insulating elastic resin material; fine metal wires having a middle portion embedded within said insulating elastic resin material so as to connect corresponding connecting terminals of said plurality of wiring boards; and a plurality of resin layers exhibiting a flexural rigidity greater than that of said insulating elastic resin material; wherein an assembly of said plurality of modules and said anisotropic conductive member is curved; and wherein said resin layers comprise at least one resin from among a heat curable resin, thermoplastic resin and ultraviolet curable resin; wherein said resin layers are shape-retaining resins for maintaining curvature of respective ones of principal surfaces of said anisotropic conductive member made to conform to curvature of said plurality of wiring boards; and wherein thickness of the shape-retaining resins is optimized in accordance with the insulating elastic resin material and the properties and shape of the shape-retaining resins.

* * * * *